(12) United States Patent
Zhang et al.

(10) Patent No.: US 10,243,328 B2
(45) Date of Patent: Mar. 26, 2019

(54) SEMICONDUCTOR LASER

(71) Applicant: Elenion Technologies, LLC, New York, NY (US)

(72) Inventors: Yi Zhang, Jersey City, NJ (US); Shuyu Yang, Jersey City, NJ (US); Michael J. Hochberg, New York, NY (US); Thomas Wetteland Baehr-Jones, Arcadia, CA (US); Saeed Fathololoumi, San Gabriel, CA (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 15/811,937

(22) Filed: Nov. 14, 2017

(65) Prior Publication Data

US 2018/0269654 A1    Sep. 20, 2018

Related U.S. Application Data

(63) Continuation-in-part of application No. 15/237,833, filed on Aug. 16, 2016, now Pat. No. 9,831,635.
(Continued)

(51) Int. Cl.
*H01S 5/00* (2006.01)
*H01S 5/14* (2006.01)
(Continued)

(52) U.S. Cl.
CPC .............. *H01S 5/141* (2013.01); *H01S 3/005* (2013.01); *H01S 3/0078* (2013.01);
(Continued)

(58) Field of Classification Search
CPC . H01S 5/146; H01S 5/141; H01S 5/14; H01S 5/4062; H01S 5/021; H01S 3/10053; H01S 3/0078; H01S 3/005
See application file for complete search history.

(56) References Cited

U.S. PATENT DOCUMENTS 5,734,665 A    3/1998   Jeon
5,778,014 A    7/1998   Islam
(Continued)

FOREIGN PATENT DOCUMENTS

WO    WO 2013/021422 A1    2/2013

OTHER PUBLICATIONS

Shu, X. et al., "Fiber grating Sagnac loop and its multiwavelength-laser application," IEEE Photonics Technology Letters, vol. 12, pp. 980-982, Aug. 2000.
(Continued)

*Primary Examiner* — Kinam Park
(74) *Attorney, Agent, or Firm* — Stratford Managers Corporation

(57) ABSTRACT

A hybrid single or multi-wavelength laser using an optical gain element, such as a semiconductor optical amplifier (SOA), for example a QD RSOA, and a semiconductor, e.g. silicon, photonics chip is demonstrated. A plurality, e.g. four, lasing modes at a predetermined, e.g. 2 nm, spacing and less than 3 dB power non-uniformity may be observed, with over 20 mW of total output power. Each lasing peak can be successfully modulated at 10 Gb/s. At $10^{-9}$ BER, the receiver power penalty is less than 2.6 dB compared to a conventional commercial laser. An expected application is the provision of a comb laser source for WDM transmission in optical interconnection systems.

20 Claims, 27 Drawing Sheets

Related U.S. Application Data which is a continuation of application No. 14/634,699, filed on Feb. 27, 2015, now Pat. No. 9,450,379, which is a continuation-in-part of application No. 14/549,130, filed on Nov. 20, 2014, now Pat. No. 9,059,559.

(60) Provisional application No. 61/906,529, filed on Nov. 20, 2013.

(51) Int. Cl.
| | |
|---|---|
| H01S 5/10 | (2006.01) |
| H01S 5/02 | (2006.01) |
| H01S 5/40 | (2006.01) |
| H01S 3/00 | (2006.01) |
| H01S 5/068 | (2006.01) |
| H01S 5/343 | (2006.01) |
| H01S 5/34 | (2006.01) |
| H01S 3/10 | (2006.01) |

(52) U.S. Cl.
CPC .......... *H01S 3/10053* (2013.01); *H01S 5/021* (2013.01); *H01S 5/06804* (2013.01); *H01S 5/1032* (2013.01); *H01S 5/1096* (2013.01); *H01S 5/14* (2013.01); *H01S 5/142* (2013.01); *H01S 5/146* (2013.01); *H01S 5/343* (2013.01); *H01S 5/3412* (2013.01); *H01S 5/4062* (2013.01)

(56) References Cited

U.S. PATENT DOCUMENTS

| | | | |
|---|---|---|---|
| 6,052,393 | A | 4/2000 | Islam |
| 6,212,216 | B1* | 4/2001 | Pillai ............... G02B 6/425 372/108 |
| 6,567,430 | B1 | 5/2003 | Islam |
| 6,741,629 | B1 | 5/2004 | Garnache |
| 6,897,434 | B1* | 5/2005 | Kumar ............... B82Y 10/00 250/227.11 |
| 7,200,308 | B2 | 4/2007 | Hochberg |
| 7,257,283 | B1 | 8/2007 | Liu |
| 7,339,724 | B2 | 3/2008 | Hochberg |
| 7,424,192 | B2 | 9/2008 | Hochberg |
| 7,480,434 | B2 | 1/2009 | Hochberg |
| 7,565,084 | B1* | 7/2009 | Wach ............... H04B 10/506 398/183 |
| 7,643,714 | B2 | 1/2010 | Hochberg |
| 7,664,157 | B2* | 2/2010 | Yamazaki .......... H01S 5/0612 372/94 |
| 7,760,970 | B2 | 7/2010 | Baehr-Jones |
| 7,894,696 | B2 | 2/2011 | Baehr-Jones |
| 8,031,985 | B2 | 10/2011 | Hochberg |
| 8,067,724 | B2 | 11/2011 | Hochberg |
| 8,098,965 | B1 | 1/2012 | Baehr-Jones |
| 8,130,802 | B2 | 3/2012 | Huber |
| 8,203,115 | B2 | 6/2012 | Hochberg |
| 8,237,102 | B1 | 8/2012 | Baehr-Jones |
| 8,258,476 | B1 | 9/2012 | Baehr-Jones |
| 8,270,778 | B2 | 9/2012 | Hochberg |
| 8,280,211 | B1 | 10/2012 | Baehr-Jones |
| 8,311,374 | B2 | 11/2012 | Hochberg |
| 8,340,486 | B1 | 12/2012 | Hochberg |
| 8,380,016 | B1 | 2/2013 | Hochberg |
| 8,390,922 | B1 | 3/2013 | Baehr-Jones |
| 8,798,406 | B1 | 8/2014 | Hochberg |
| 8,818,141 | B1 | 8/2014 | Hochberg |
| 9,059,559 | B2 | 6/2015 | Zhang |
| 9,450,379 | B2 | 9/2016 | Zhang |
| 2003/0053192 | A1 | 3/2003 | Islam |
| 2004/0228564 | A1* | 11/2004 | Gunn, III .......... G02B 6/12004 385/1 |
| 2005/0185879 | A1 | 8/2005 | Dawes |
| 2006/0153267 | A1 | 7/2006 | Suzuki |
| 2009/0122817 | A1* | 5/2009 | Sato .................. G02B 6/12007 372/20 |
| 2009/0285251 | A1 | 11/2009 | Yamazaki |
| 2010/0014545 | A1 | 1/2010 | Lee |
| 2010/0296812 | A1 | 11/2010 | Asghari |
| 2011/0038036 | A1* | 2/2011 | Todt .................. H01S 5/0264 359/341.1 |
| 2011/0310917 | A1 | 12/2011 | Krishnamoorthy |
| 2012/0195332 | A1* | 8/2012 | Yoffe .................. H01S 5/1032 372/20 |
| 2013/0083815 | A1 | 4/2013 | Fang |
| 2013/0170843 | A1 | 7/2013 | Baney |
| 2015/0139256 | A1 | 5/2015 | Dallesasse |

OTHER PUBLICATIONS

A.W. Fang et al., "Electrically Pumped Hybrid AlGaInAs-silicon Evanescent Laser," Optics Express, vol. 14, pp. 9203-9210, (2006).

T. Wang et al., "1.3-μm InAs/GaAs Quantum-Dot Lasers Monolithically Grown on Si Substrates," Optics Express, vol. 19, Issue 12, pp. 11381-11386 (2011).

Zhou, J. et al., "All-fiber mode-locked ring laser with a Sagnac filter," IEEE Photonics Technology Letters, vol. 23, pp. 1301-1303, Sep. 15, 2011.

A.J. Zilkie et al., "Power-efficient III-V/Silicon External Cavity DBR Lasers," Optics Express, vol. 20, pp. 23456-23462 (2012).

R.E. Camacho-Aguilera et al., "An Electrically Pumped Germanium Laser," Optics Express, vol. 20, pp. 11316-11320 (2012).

S. Keyvaninia et al., "Demonstration of a Heterogeneously Integrated III-V/SOI Single Wavelength Tunable Laser," Optics Express, vol. 21, pp. 3784-3792, (2012).

S. Tanaka et al., "High-Output-Power, Single-Wavelength Silicon Hybrid Laser Using Precise Flip-Chip Bonding Technology," Optics Express, vol. 20, pp. 28057-28069, (2012).

S. Yang et al., "A Single Adiabatic Microring-Based Laser in 220 nm Silicon-on-Insulator," Opt. Express 22(1) pp. 1172-1180 (2013).

T. Creazzo et al., "Integrated Tunable CMOS Laser," Optics Express, vol. 21, pp. 28048-28053 (2013).

Zhang et al., "Sagnac Loop Mirror and Micro-Ring Based Laser Cavity for Silicon-On-Insulator," Opticas Express, vol. 22, No. 15, Jul. 28, 2014, pp. 17872-17878.

Yang et al., "Quantum Dot Semiconductor Optical Amplifier/ Silicon External Cavity Laser for O-Brand High-Speed Optical Communications," Optical Engineering, vol. 54(2), Feb. 12, 2015, pp. 026102-026102-4.

International Search Report, PCT/US2014/66657, dated Feb. 23, 2015 (3 pages).

Written Opinion of the International Searching Authority, PCT/US2014/66657, dated Feb. 23, 2015 (4 pages).

International Search Report, PCT/US2016/19987, dated Sep. 7, 2016 (2 pages).

Written Opinion of the International Searching Authority, PCT/US2016/19987, dated Sep. 7, 2016 (6 pages).

Supplementary Partial European Search Report for European Application No. EP 14864248, dated Jun. 7, 2017 (13 pages).

\* cited by examiner

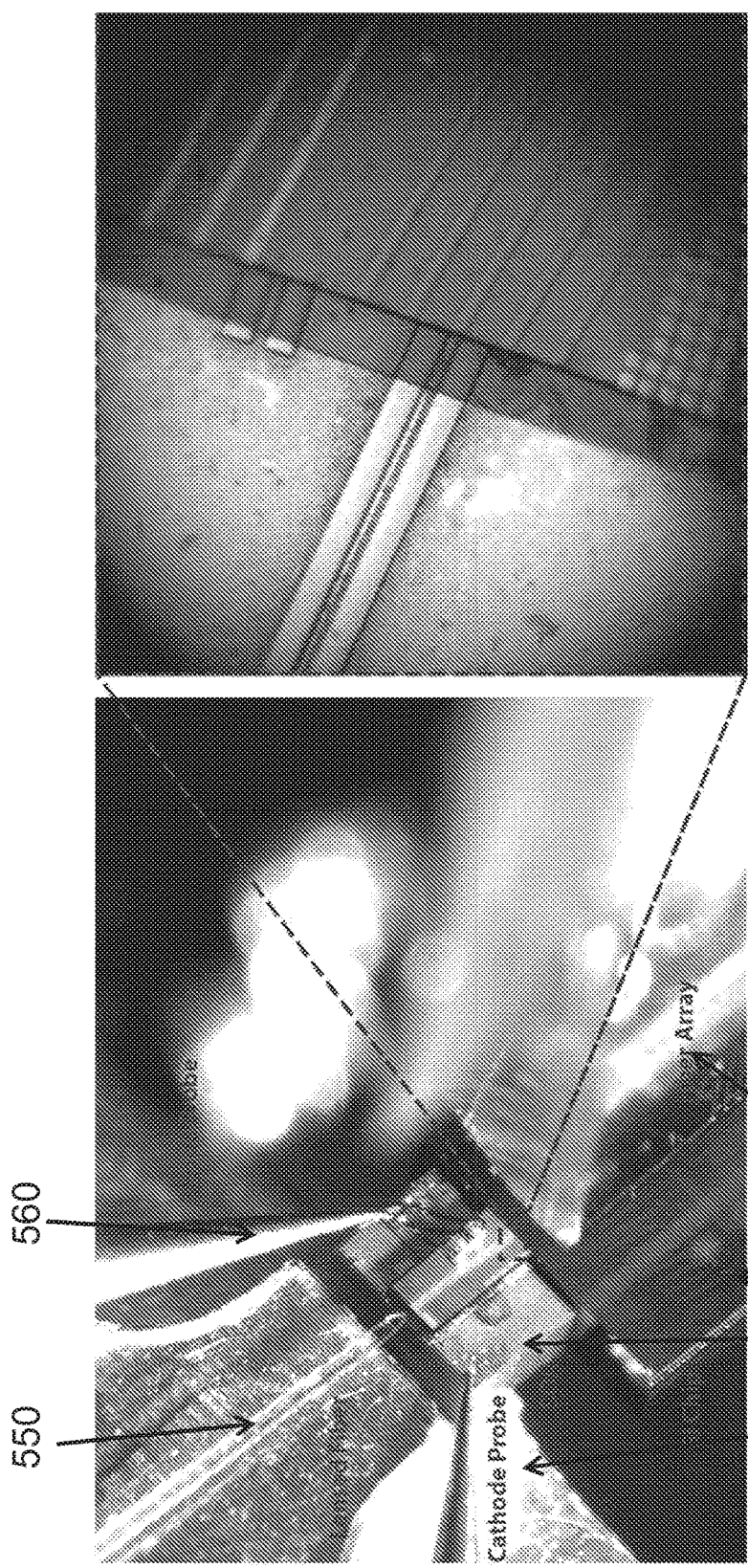

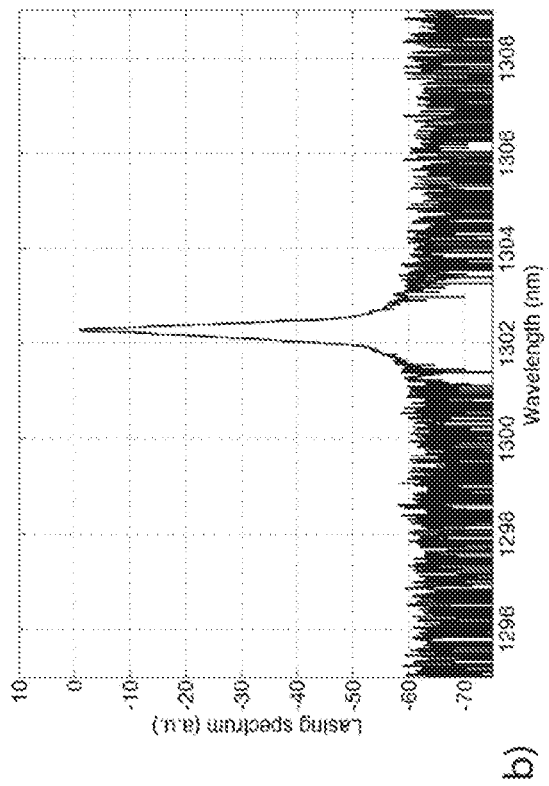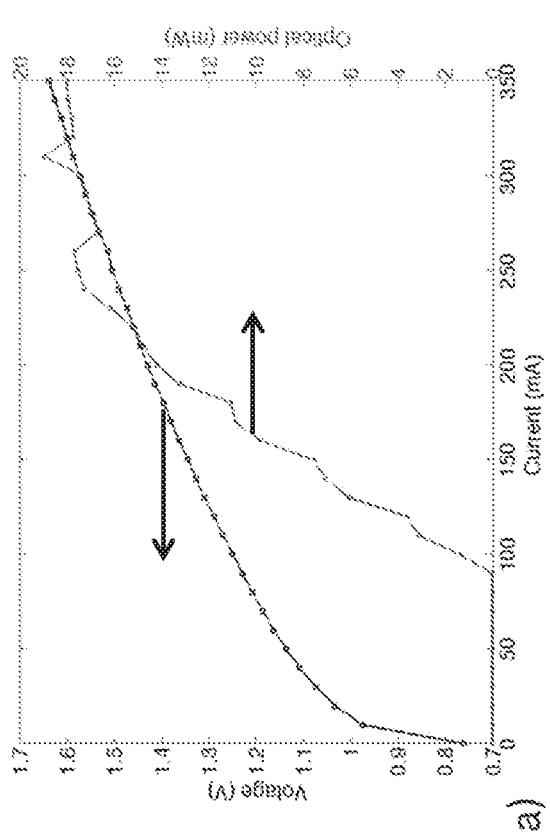
FIG. 12B
FIG. 12A

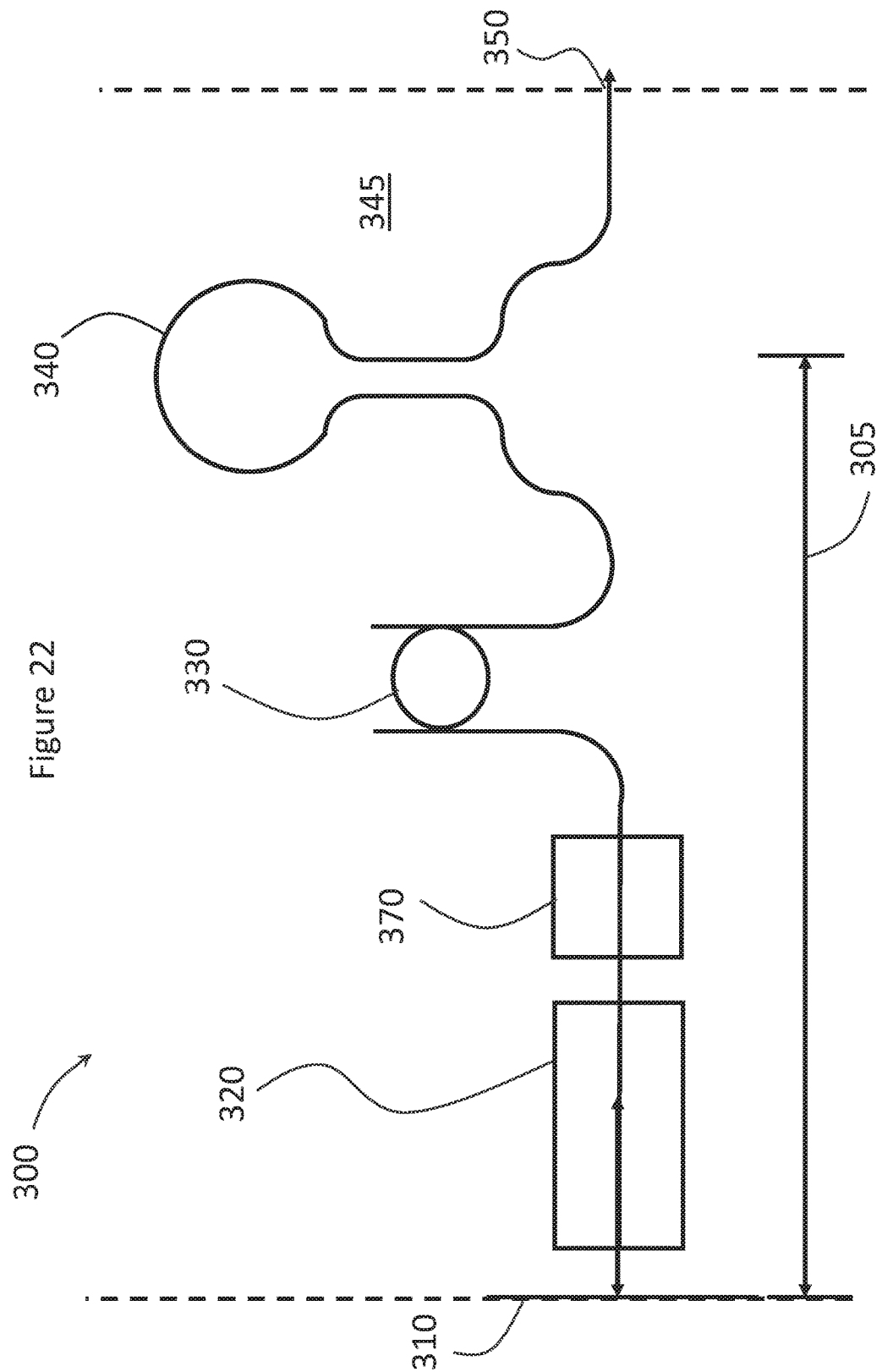

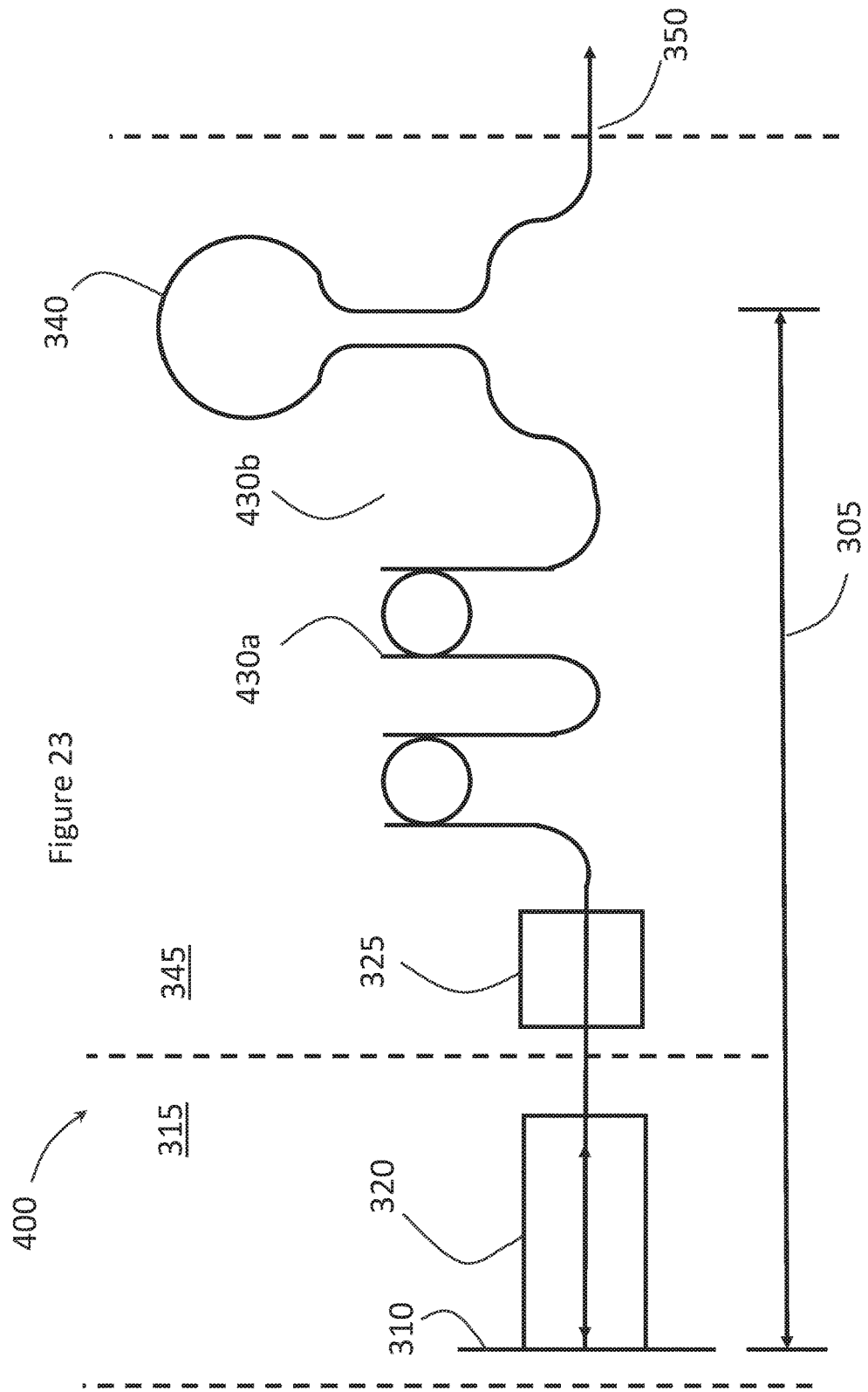

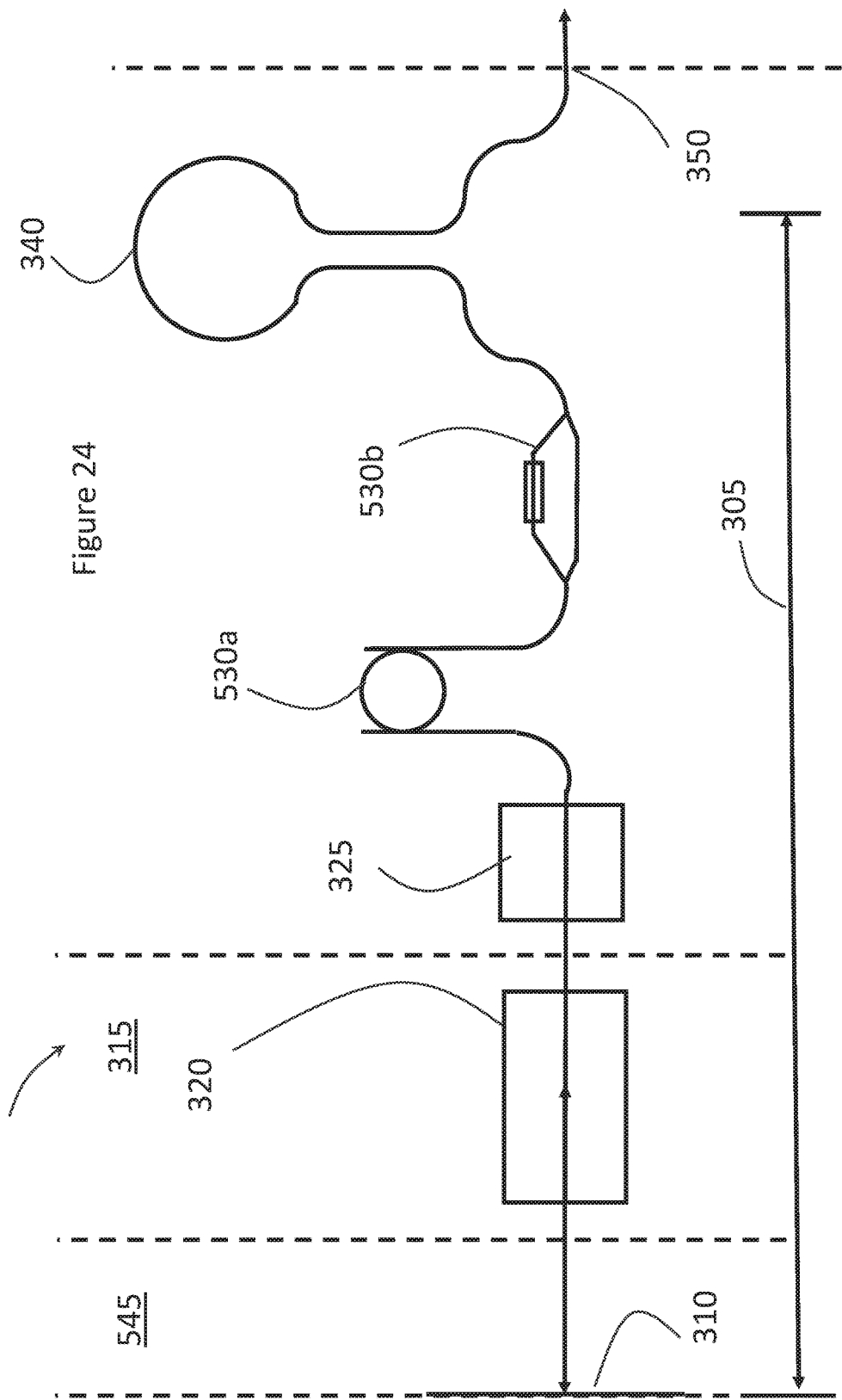

SEMICONDUCTOR LASER

CROSS-REFERENCE TO RELATED APPLICATIONS

This application is a continuation-in-part of co-pending U.S. patent application Ser. No. 15/237,833, filed Aug. 16, 2016, which is a continuation of U.S. patent application Ser. No. 14/634,699, filed Feb. 27, 2015, now U.S. Pat. No. 9,450,379, which is a continuation-in-part of U.S. patent application Ser. No. 14/549,130, filed Nov. 20, 2014, now U.S. Pat. No. 9,059,559, and claims the benefit and priority thereof, which application in turn claims priority to and the benefit of U.S. Provisional Patent Application No. 61/906,529, filed Nov. 20, 2013, each of which is incorporated herein by reference in its entirety.

STATEMENT REGARDING FEDERALLY FUNDED RESEARCH OR DEVELOPMENT

This invention was made with government support under FA-9550-10-1-0439 awarded by Air Force Office of Scientific Research (AFOSR). The government has certain rights in the invention.

TECHNICAL FIELD

The present invention relates to optical cavities, and in particular to an optical cavity that can be used with lasers.

BACKGROUND

Semiconductor lasers and optical amplifiers are preferred in transceivers because they are efficiently electrically pumped and the die size is small. Lasing is a radiative recombination process in semiconductors, where an electron in the conduction recombines with a hole in the valance band and a photon is emitted. The reverse process is electron hole pair generation through optical absorption, as occurs in such devices as photodetectors and solar cells.

Silicon photonics is widely seen as an enabling technology to address the exponentially increasing demand for data communication bandwidth. Lasers are critical components in data transmission systems. Two fundamental elements for a laser are its gain medium and resonating cavity. Due to the indirect bandgap of silicon, several approaches of introducing gain medium into the photonic integration material system has been reported, including edge coupled bonding (see, for example A. J. Zilkie, P. Seddighian, B. J. Bijlani, W. Qian, D. C. Lee, S. Fathololoumi, J Fong, R. Shafiiha, D. Feng, B. J. Luff, X. Zheng, J. E. Cunningham, A. V. Krishnamoorthy, and M. Asghari, "Power-efficient III-V/Silicon external cavity DBR lasers," Optics Express, Vol. 20, pp. 23456-23462, 2012; S. Tanaka, S. H. Jeong, S. S., T. Kurahashi, Y. Tanaka, and K. Morito, "High-output-power, single-wavelength silicon hybrid laser using precise flip-chip bonding technology," Optics Express, Vol. 20, pp. 28057-28069, 2012), direct bonding (see, for example A. W. Fang, H. Park, O. Cohen, R. Jones, M. J. Paniccia, and J. E. Bowers, "Electrically pumped hybrid AlGaInAs-silicon evanescent laser," Optics Express, Vol. 14, pp. 9203-9210, 2006; S. Keyvaninia, G. Roelkens, D. Van Thourhout, C. Jany, M. Lamponi, A. Le Liepvre, F. Lelarge, D. Make, G. H. Duan, D. Bordel, and J. M. Fedeli, "Demonstration of a heterogeneously integrated III-V/SOI single wavelength tunable laser," Optics Express, Vol. 21, pp. 3784-3792, 2012; T. Creazzo, E. Marchena, S. B. Krasulick, P. Yu, D. Van Orden, J. Y. Spann, C. C. Blivin, L. He, H. Cai, J. M. Dallesasse, R. J. Stone, and A. Mizrahi, "Integrated tunable CMOS laser," Optics Express, Vol. 21, pp. 28048-28053, 2013), heavily N-doped germanium (see, for example R. E. Camacho-Aguilera, Y. Cai, N. Patel, J. T. Bessette, M. Romagnoli, L. C. Kimerling, and J. Michel, "An electrically pumped germanium laser," Optics Express, Vol. 20, pp. 11316-11320, 2012), and quantum dot structures (see, for example T. Wang, H. Liu, A. Lee, F. Pozzi, and A. Seeds, "1.3-.mu.m InAs/GaAs quantum-dot lasers monolithically grown on Si substrates," Optics Express, Vol. 19, Issue 12, pp. 11381-11386 (2011)). Laser cavities are usually built using Distributed Bragg Reflectors (DBRs), or DBRs together with ring resonator filters, which require high lithography resolution and are sensitive to fabrication variations.

Conservation of both energy and momentum are required in the lasing process. Energy conservation is satisfied because the emitted photon's energy is equal to the bandgap of the semiconductor. However, a photon's momentum is negligible compared to that of an electron or a hole. To meet the momentum conservation requirement, the top of the valence band and the bottom of the conduction band need to be aligned. In other words, the semiconductor needs to be a direct bandgap material. A number of III-V compound materials such as gallium arsenide (GaAs) and indium phosphide (InP) are direct bandgap semiconductors. However, silicon is an indirect bandgap semiconductor.

Raman silicon lasers have been demonstrated. Making an electrically pumped silicon laser is prohibitively difficult. Another gain material has to be introduced into the silicon material system in which laser action is desired. Various gain integration approaches have been reported, including monolithic epitaxy, wafer bonding, and SOA edge coupling.

X. Shu, S. Jiang, and D. Huang, "Fiber grating Sagnac loop and its multiwavelength-laser application," IEEE Photonics Technology Letters, Vol. 12, pp. 980-982, 2000 is said to describe a novel simple comb filter, which is based on a Sagnac interferometer with a fiber Bragg grating asymmetrically located in its fiber loop. The filter has advantages of simple design and easy fabrication, low insertion loss and low cost. Two filters with triple bandpasses and dual bandpasses, respectively, were fabricated and applied to an erbium-doped fiber ring laser. Stable triple-wavelength and dual-wavelength laser operations have been demonstrated.

J. Zhou, P. Yan, H. Zhang, D. Wang, and M. Gong, "All-fiber mode-locked ring laser with a Sagnac filter," IEEE Photonics Technology Letters, Vol. 23, pp. 1301-1303, 2011 is said to describe the following: Terbium-doped mode-locked fiber lasers are versatile sources of femtosecond pulses. The development of new pulse-shaping mechanisms in fiber lasers allows the generation of higher energy femtosecond pulses than the solution mode-locked lasers which are required in the application. However the pulses from Yb-doped mode-locked fiber lasers are longer in width than the solution pulses due to the normal dispersion of the fiber. Thus grating pairs are necessary in and out of the cavity to provide negative dispersion. An All-Normal-Dispersion (ANDi) Yb-doped fiber laser has been demonstrated with a spectral filter instead of the grating pair in the cavity. The spectral filtering of a highly-chirped pulse in the laser cavity is the key component of the pulse shaping in this type of mode-locked laser. The influence of the bandwidth of the filter on the mode-locking has been theoretically investigated. The bulk interference or birefringent filter is commonly used as the spectral filter. In order to develop the all-fiber configuration free from misalignment some fiber-type filters have been investigated. Recently an all-fiber Lyot filter with a section of Polarization Maintaining (PM) fiber has been used as the spectral filter in ANDi laser and 240 fs dechirped pulses were obtained. According to the discussion in [2], [3] the duration of the mode locked pulse diminishes with the decrease of the filtering bandwidth until the mode-locking fails. The Lyot filter can be used as a bandwidth-tunable filter as the bandwidth depends on the length of the PM fiber. However the modulation depth of the Lyot filter is dominated by the Polarization Controllers (PCs).

There is a need for an improved external cavity for use with lasers.

SUMMARY OF THE INVENTION

Accordingly, the present invention relates to a semiconductor laser, comprising:

an optical port configured to provide an optical output beam comprising one or more selected optical wavelengths;

an optical cavity, in optical communication with the optical port, comprising:

a first reflector at a first end of the optical cavity, said first reflector comprising a first reflectivity; and a second reflector at a second end of the optical cavity, the second reflector comprising a second reflectivity;

an optical gain medium in the optical cavity for amplifying light at the one or more selected wavelengths;

a filter element in the optical cavity configured to pass light of the one or more selected optical wavelengths therethrough to the optical gain medium and deflect wavelengths not of interest away from said optical gain medium to suppress stimulated emission of those wavelengths; and a phase tuner in the optical cavity capable of adjusting a phase of the light in the optical cavity for adjusting a resonant wavelength of the optical cavity.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 5A is an image of the testing setup.

FIG. 5B is a close-up view of the SOA silicon chip interface.

FIG. 12A is a graph of laser bias voltage and output power as a function of pump current.

FIG. 12B is a graph of the optical spectrum of the QD O-Band laser.

FIG. 22 illustrates an alternative embodiment of the present invention including a phase section;

FIG. 23 illustrates an alternative embodiment of the present invention including multiple filters.

FIG. 24 illustrates an alternative embodiment of the present invention including multiple different filters.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Acronyms

A list of acronyms and their usual meanings in the present document (unless otherwise explicitly stated to denote a different thing) are presented below.

AMR Adabatic Micro-Ring
APD Avalanche Photodetector
ARM Anti-Reflection Microstructure
ASE Amplified Spontaneous Emission
BER Bit Error Rate
BOX Buried Oxide
[CMOS Complementary Metal-Oxide-Semiconductor
CMP Chemical-Mechanical Planarization
DBR Distributed Bragg Reflector
DC (optics) Directional Coupler
DC (electronics) Direct Current
DCA Digital Communication Analyzer
DRC Design Rule Checking
DUT Device Under Test
ECL External Cavity Laser
FDTD Finite Difference Time Domain
FOM Figure of Merit
FSR Free Spectral Range
FWHM Full Width at Half Maximum
GaAs Gallium Arsenide
InP Indium Phosphide
$LiNO_3$ Lithium Niobate
LIV Light intensity (L)-Current (I)-Voltage (V)
MFD Mode Field Diameter
MPW Multi Project Wafer
NRZ Non-Return to Zero
PIC Photonic Integrated Circuits
PRBS Pseudo Random Bit Sequence
PDFA Praseodymium-Doped-Fiber-Amplifier
PSO Particle Swarm Optimization
Q Quality factor Q=$2\pi\times$Energy Stored Energy dissipated per cycle=$2\pi f\times$Energy Stored/Power Loss
QD Quantum Dot
RSOA Reflective Semiconductor Optical Amplifier
SOI Silicon on Insulator
SEM Scanning Electron Microscope
SMSR Single-Mode Suppression Ratio
TEC Thermal Electric Cooler
WDM Wavelength Division Multiplexing Hybrid Laser Integration A high quality laser is critical to the performance of any optical data links. Because silicon doesn't lase at optical wavelengths used for telecommunication, external gain material has to be integrated in a CMOS compatible manner. Silicon waveguide distributed Bragg gratings require sub-50 nm feature size and are difficult to manufacture. A reliable cavity is also needed to provide feedback for lasing operation. We describe a novel laser cavity configuration utilizing a Sagnac loop mirror and micro-ring resonator. Hybrid lasers based on such cavity are demonstrated with 1.2 MHz linewidth, 4.8 mW on-chip output power, and over 40 dB side mode suppression ratio.

High Index Contrast Silicon Waveguides

Figures 1A, 1B:
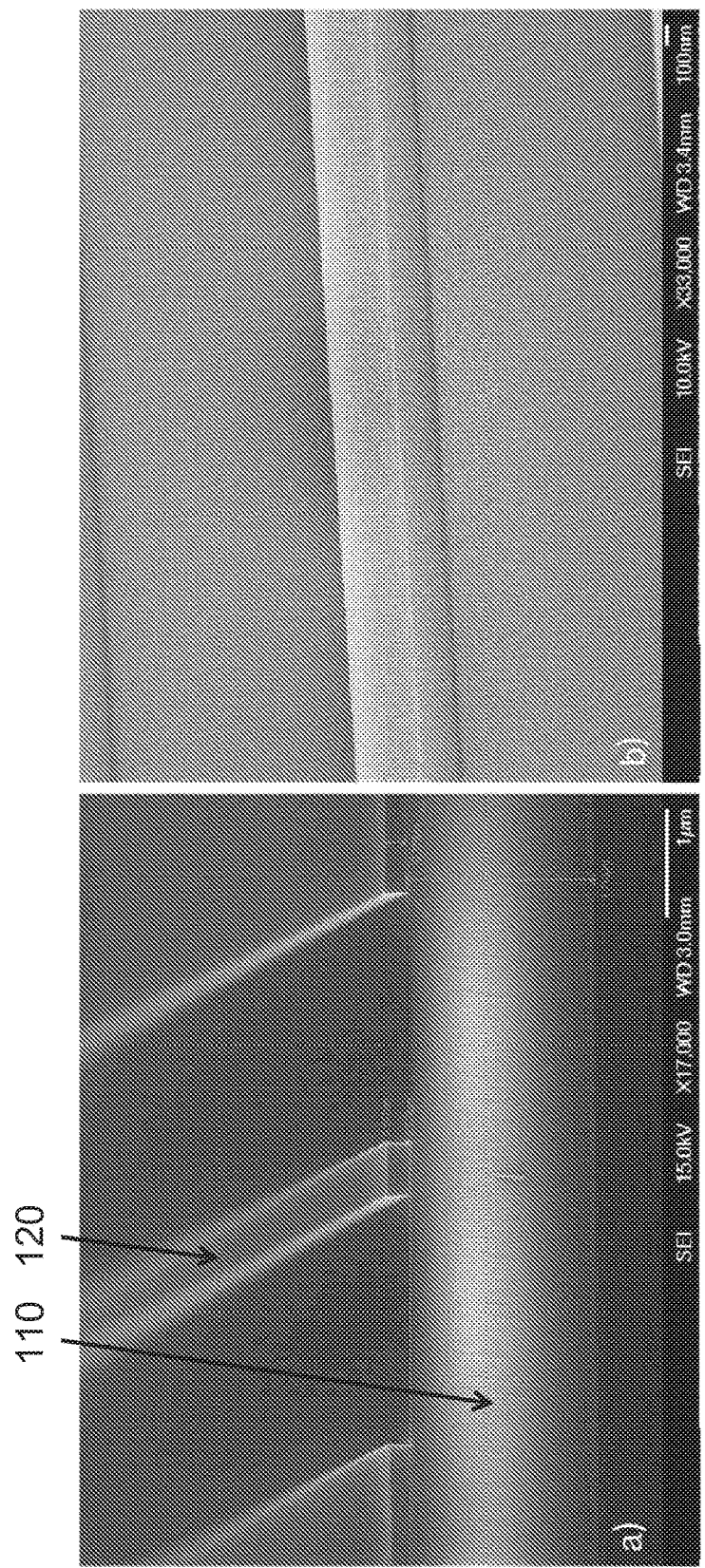
FIG. 1A is a cross sectional SEM image of submicron silicon waveguides.
FIG. 1B is a perspective view SEM image of submicron silicon waveguides.

FIG. 1A is a cross sectional SEM image of submicron silicon waveguides. Both the silicon device layer and the buried oxide are clearly visible in FIG. 1A. The silicon dioxide layer 110 is 1.7 µm thick, the silicon waveguide 120 is 0.17 µm (170 nm) thick and 0.507 µm (507 nm) wide, and a lateral repeat distance between silicon structures is 2.774 µm. The waveguides are patterned using JBX-6300FS electron beam lithography system and etched using an inductively coupled plasma reactive ion etcher.

FIG. 1B is a perspective view SEM image of submicron silicon waveguides.

Sagnac Loop and Micro-Ring External Cavity Laser

The device was fabricated by a foundry. The Sagnac loop mirror transmittance and reflectivity can be predicted analytically as it contains only a directional coupler other than a routing waveguide.

Figure 2:
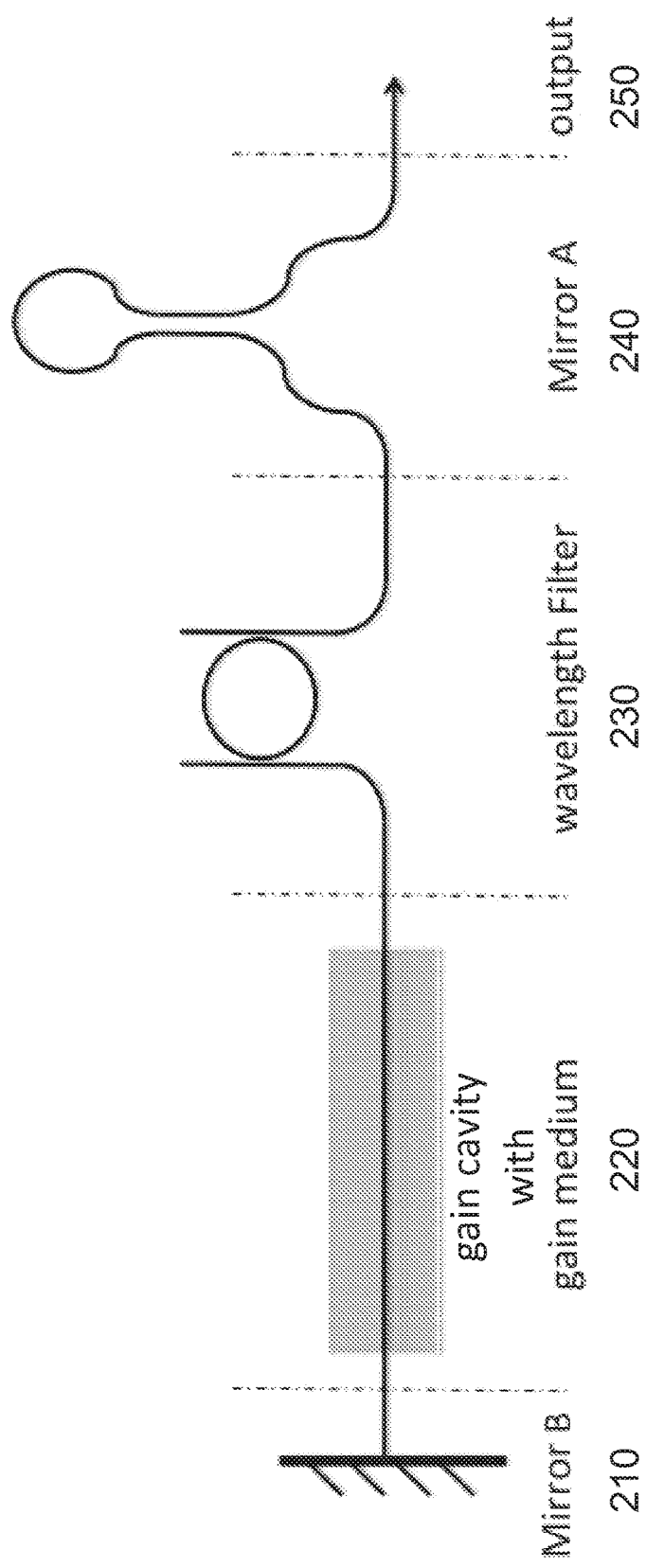
FIG. 2 is a schematic diagram of a Sagnac loop mirror based laser cavity configuration according to principles of the invention.

FIG. 2 is a schematic diagram of a laser cavity configuration based on a Sagnac loop mirror as a first partial reflector. The Sagnac loop mirror based laser cavity is a preferred embodiment, but other partial reflectors are possible. The Sagnac loop Mirror A 240 may be made up of a directional coupler (DC) with its branches tied together on one side. Ideally the Sagnac loop mirror 240 contains no ultra-fine features other than two parallel waveguides, and can be fabricated by a single etch step on a suitable substrate, e.g. Silicon. Typically, the reflectivity of the first partial reflector 240 is about 50%; however, other reflectivity is possible, e.g. 35% to 65% of wavelengths passing through the optical cavity.

In FIG. 2 a wavelength filter 230 may be a micro-ring that is fixed at a critical coupling condition for wavelength filtering, and the first partial reflector, e.g. the Sagnac loop Mirror A 240, is used for broadband reflection at one end of the optical cavity. There may be only one output port 250. In some embodiments, the output port 250 can also be used as an input port. The reflectivity of Sagnac loop Mirror A 240 can be accurately controlled by adjusting a coupling length. In some embodiments, a second Mirror B 210 having a high reflectivity, e.g. greater than 95%, ideally greater than 99%, and low transmittance is used at the other end of the optical cavity. Implementation of the second Mirror B 210 depends on the gain medium integration technique. The second reflector 210 could be the high reflection end of a reflective SOA in the case of edge-coupled integration, another Sagnac loop mirror in the case of the direct bonding approach or other suitable highly reflective reflector.

A gain element 220 may be a gain medium provided in a gain cavity in or on the substrate or provided in a separate SOA chip. As shown in the embodiment of FIG. 2, the second reflector, e.g. Mirror B 210, and the first reflector, e.g. Sagnac loop Mirror A 240, form the ends of an optical cavity (or optical resonator) structure. The gain element 220, e.g. the gain medium in the gain cavity, and the filter 230 are provided within the optical cavity structure in serial communication. In different embodiments, the gain element 220, e.g. the gain medium in the gain cavity, and the filter 230 can be provided in any order, as long as the serial communication is preserved. In preferred embodiments, for purposes of convenience of manufacture, it may be helpful to have the filter 230 and the first reflector, e.g. Sagnac loop Mirror A 240, in physical proximity to each other if the filter 230 is a micro-ring filter. In the embodiment illustrated in FIG. 2, the micro-ring filter 230 and the Sagnac loop Mirror A 240 are independent and can be optimized separately. This is a robust device, with low excess loss.

In the embodiment illustrated in FIG. 2, a racetrack ring resonator was used as the wavelength filter 230. The ring has a radius of 10 µm, and a 1.5 µm long straight DC to maintain critical coupling. The ring FSR is 8.7 nm, and FWHM is 0.075 nm, corresponding to a Q of 20 000. Because the ring resonator 230 is a comb filter and has multiple pass bands, the device is expected to lase at one or more resonant wavelengths near the top of the SOA gain spectrum.

In some embodiments, the specific structure of the optical cavity can include a reflector that is situated on a silicon chip as the second highly reflective reflector 210, for example fabricated from an SOI wafer and the gain medium is provided by a III/V semiconductor material or fabricated on a separate chip as a semiconductor optical amplifier (SOA) with a reflective facet. The coupling can include one or more of butt-coupling, using tapers or inverse tapers for expanded beam coupling, using lenses for coupling or lens arrays for coupling.

In some embodiments, the optical cavity can be operated using uncooled operation, in which the temperature is allowed to be free-running. In some embodiments, the optical cavity can be operated nonhermetically. In some embodiments, one or more components of the optical cavity can be hermetically sealed at the die level. One or more phase tuners 270 may be provided between the first reflector 240 and the wavelength filter 230 or between the wavelength filter 230 and the gain element 220 for tuning the phase of the light in the optical cavity. The phase tuners 270 may be provided on the primary semiconductor chip or on the secondary gain element, e.g. SOA, chip.

In some embodiments, there are included one or more highly reflective, partially reflective or wavelength selective optical coatings on an optical facet, e.g. on the SOA, on the silicon side of the silicon chip, on the Group III/V semiconductor side or both.

In various embodiments, the optical cavity provides an optical output beam that can comprise a single wavelength of interest, or a plurality of wavelengths of interest. In some embodiments the optical cavity provides an optical output beam that is a narrow linewidth optical output beam Laser Physics An optical cavity or optical resonator comprises mirrors that form a standing wave cavity resonator for light waves. Optical cavities are a major component of lasers, surrounding the gain medium and providing feedback of the laser light. They are also used in optical parametric oscillators and some interferometers. Light confined in the cavity reflects (or passes) multiple times between the mirrors, producing standing waves for certain resonance frequencies. The standing wave patterns produced are referred to as modes. Longitudinal modes differ only in frequency while transverse modes differ for different frequencies and have different intensity patterns across the cross section of the beam.

In a laser, there is a gain medium which amplifies light. Laser pumping involves energy transfer from an external source into the gain medium of a laser. Different gain media can be pumped by various methods, which can include the provision of energy from electrical sources, optical sources, or even chemical sources. The gain medium absorbs energy and creates excited atomic states. When the number of particles in one excited state exceeds the number of particles in the ground state or a less-excited state, population inversion is achieved. When the excited atomic states relax (return to the ground state) a photon is emitted. In lasers, the emission from the excited states can be caused to happen by the presence of photons having energy that matches the energy difference between the excited state and the ground state. The emitted photons have the same wavelength and direction and are in phase with the light that stimulates the excited state to emit, which condition is termed coherency. The emission process in lasers is termed stimulated emission, which is the reason why the name LASER (Light Amplification by Stimulated Emission of Radiation) was selected. In order for laser operation to occur, the pump power must be higher than the lasing threshold of the laser.

In operation, light passes back and forth in the optical cavity between the first reflector, e.g. Mirror A 240 and the second reflector, e.g. Mirror B 210. The gain element 220, e.g. the gain medium in the gain cavity or the SOA, amplifies the light so that the intensity increases each time the light passes through the gain element 220. The filter 230 filters out the wavelengths that are not of interest, so that stimulated emission of those wavelengths is suppressed. To the extent that the filter 230 can be used to select one or more discrete wavelengths to pass, the wavelength of the laser light can be tuned.

Depending on the type of gain medium that is employed, the power to pump the gain medium can be selected from any convenient power source having the proper characteristics (e.g., electrical power, optical power, or the like). In various embodiments of the invention, the gain medium can be an electrically pumped gain medium, an optically pumped gain medium, or even a chemically pumped gain medium. The gain medium can be a solid, a liquid, or a gas.

Figure 4:
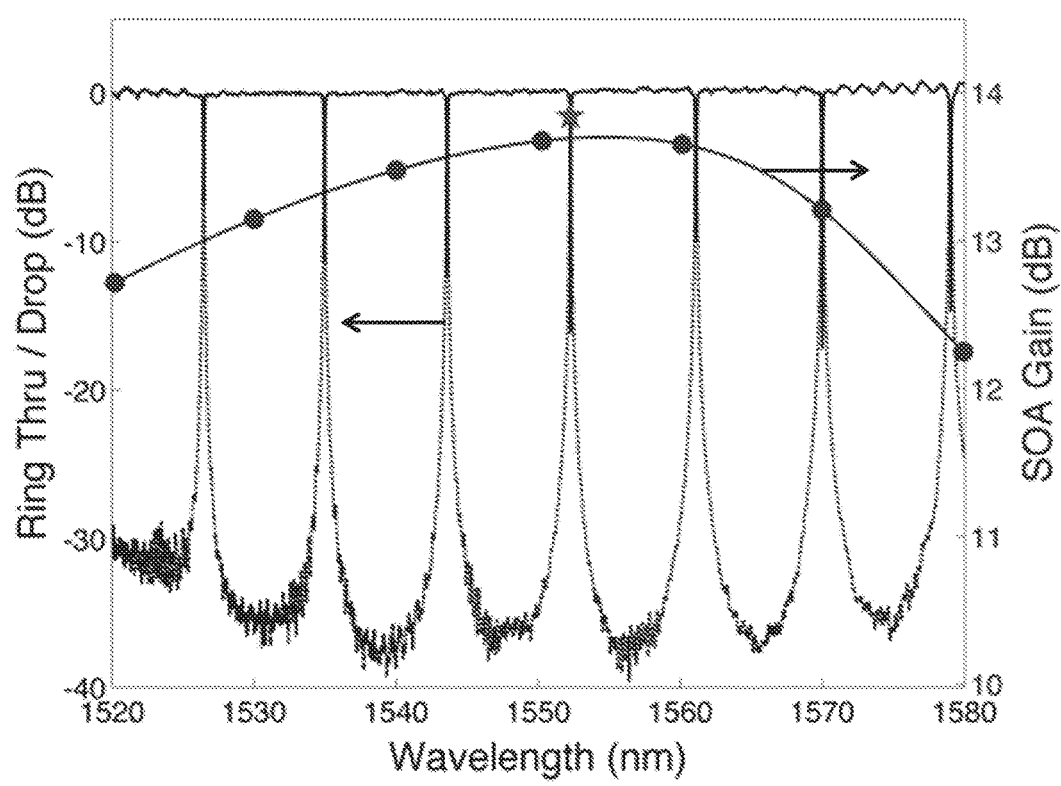
FIG. 4 Ring filter drop (solid) and through (dashed) spectrum, and SOA gain spectrum at 150 mA (blue). The expected lasing wavelength (1552.3 nm) is labeled by a red pentagram.

FIG. 4 shows a ring filter drop (solid) and through (dashed) spectrum, and SOA gain spectrum at 150 mA. The expected lasing wavelength (1552.3 nm) is indicated by a star.

From the diagram in FIG. 2, it is straightforward to see that the Sagnac loop Mirror A 240 has 100% transmittance for a DC coupling ratio of either 0 or 100%. Since the DC is symmetric, transmittance T at an arbitrary coupling length, x, can be predicted by $$T = \cos^2\left(\frac{\pi}{L}x + \varphi\right)$$

where L is the 100% coupling length, and $\varphi$ represents the contribution of coupling from waveguide bends. Reflectivity equals to 1-T since excess loss of DC is negligible. To characterize the Sagnac loop mirror transmittance or reflectivity, structures shown as Mirror A 240 in FIG. 2 with different coupling lengths, directly connected to two grating couplers, were measured using a tunable laser.

Figure 3B:
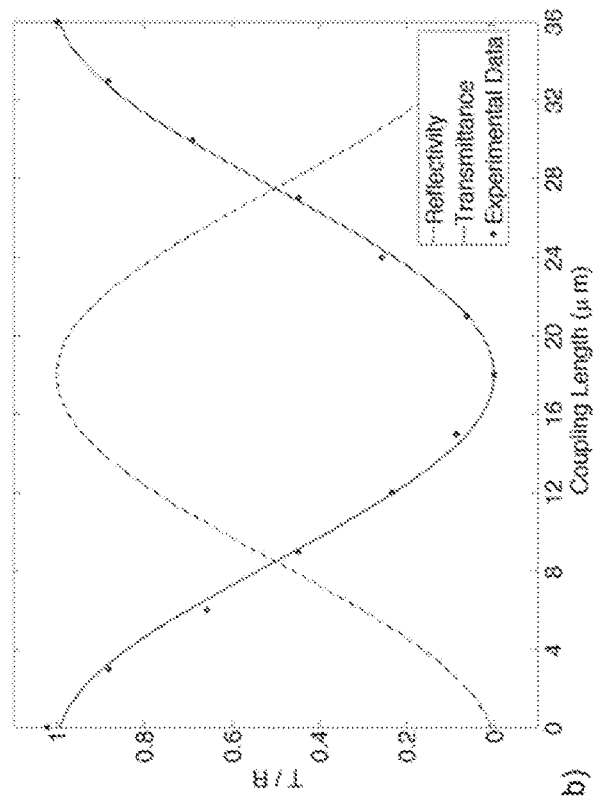
FIG. 3B is a graph of the transmittance and reflectivity of the Sagnac loop mirror as a function of DC coupling length at 1550 nm wavelength.
Figure 3A:
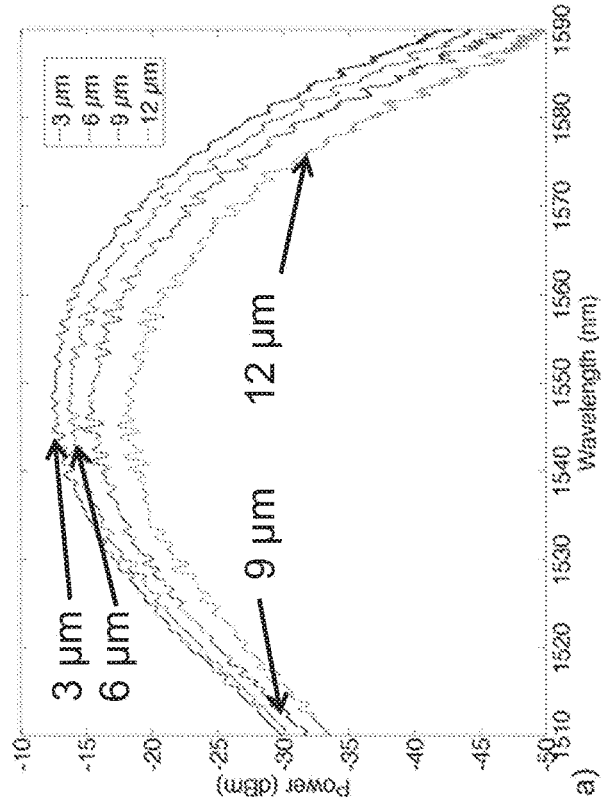
FIG. 3A is a graph of the Sagnac loop mirror transmission spectrum measured using a tunable laser and grating couplers.

FIG. 3A is a graph of the Sagnac loop mirror transmission spectrum measured using a tunable laser and grating couplers. The parabolic line shape and ripples are caused by the spectral response of the grating couplers. Reduction in power indicates decrease of transmittance as coupling length varies from 3 µm to 12 µm.

FIG. 3B is a graph of the transmittance and reflectivity of the Sagnac loop mirror as a function of DC coupling length at 1550 nm wavelength. The measured data matches well with theory, as is seen in FIG. 3B. The mirror transmittance and reflectivity can be accurately controlled by choosing the corresponding coupling length.

Figure 3C:
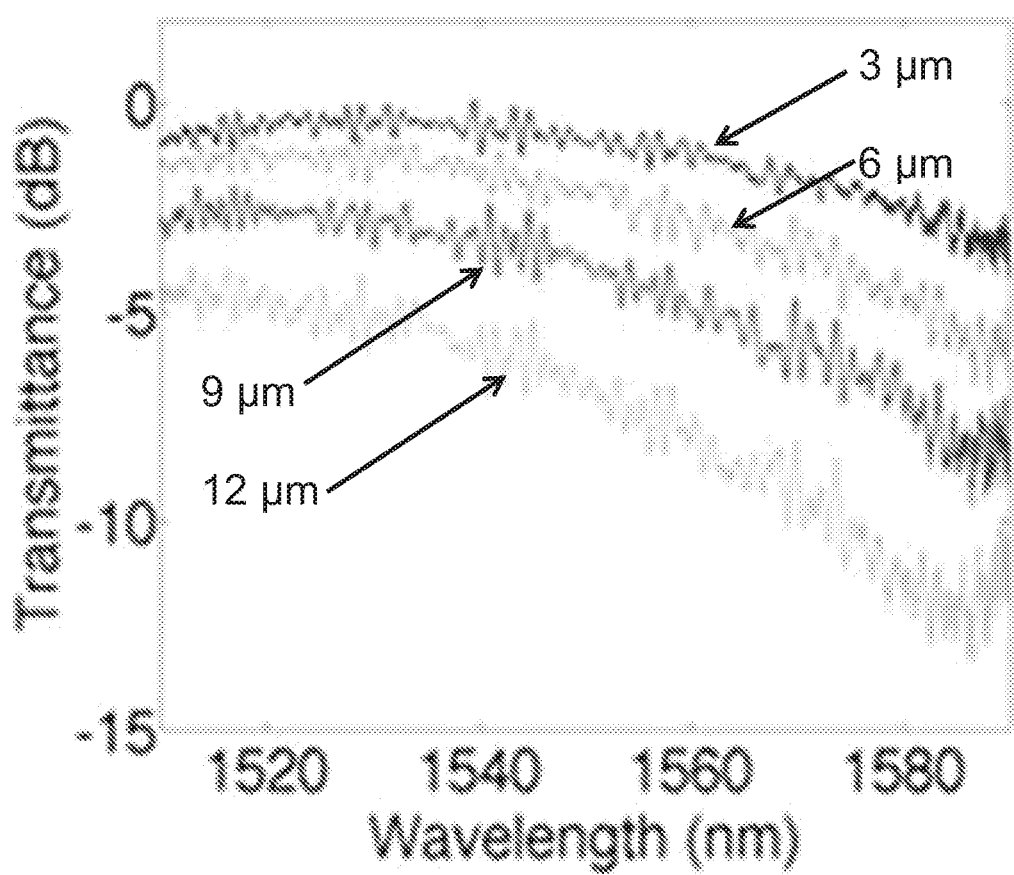
FIG. 3C is a graph of the normalized transmittance spectrum.

FIG. 3C is a graph of the normalized transmittance spectrum. Waveguide confinement decreases as the working wavelength is red shifted, hence evanescent coupling, and as a result the reflectivity of the Sagnac loop mirror, is stronger at longer wavelength, as shown in FIG. 3C.

The diced silicon chip was first polished to create a flat and smooth sidewall for edge coupling. An ultra-thin edge coupler was employed to match the SOA mode for low coupling loss, using the methods described in S. Yang, Y. Zhang, D. W. Grund, G. A. Ejzak, Y. Liu, A. Novack, D. Prather, A. E-J Lim, G-Q Lo, T. Baehr-Jones, and M. Hochberg, "A single adiabatic microring-based laser in 220 nm silicon-on-insulator," Opt. Express 22(1), 1172-1180 (2013). A half-cavity on silicon chip was aligned to the SOA using a six-axis stage.

An image of the testing setup is shown in FIG. 5A. As illustrated in FIG. 5A, a cathode probe 510 and an anode probe 560 are used to provide pump current to a SOA 520. The SOA was kept at 25° C. by a TEC. The silicon chip 530 sat on a metal chuck and stayed at room temperature, 15 to 20° C. A lensed fiber 550 was used to collect light from the high reflection end of the SOA to monitor the intra-cavity power as a feedback signal during alignment. A fiber optic bundle 540 was aligned to probe the output grating coupler.

On the silicon chip, the output grating coupler is first connected to a y-junction, which has 3 dB intrinsic loss due to power splitting and 0.3 dB excess loss. One branch of the y-junction is connected to another grating coupler 127 µm away, matching the fiber pitch in the fiber array, while the other branch lead to the output waveguide of the hybrid laser. With the hybrid laser turned off, the fiber array was actively aligned to the grating coupler loop using an Agilent laser and power meter. The grating coupler loss was simultaneously characterized to be 8.5 dB, which is higher than is typically seen during wafer scale testing, because it was kept further to the chip surface as precaution. Then the Agilent laser was turned off and hybrid laser turned on, a sharp threshold behavior near 60 mA was observed when varying the pump current.

FIG. 5B is a close-up view of the SOA silicon chip interface.

Figure 5C:
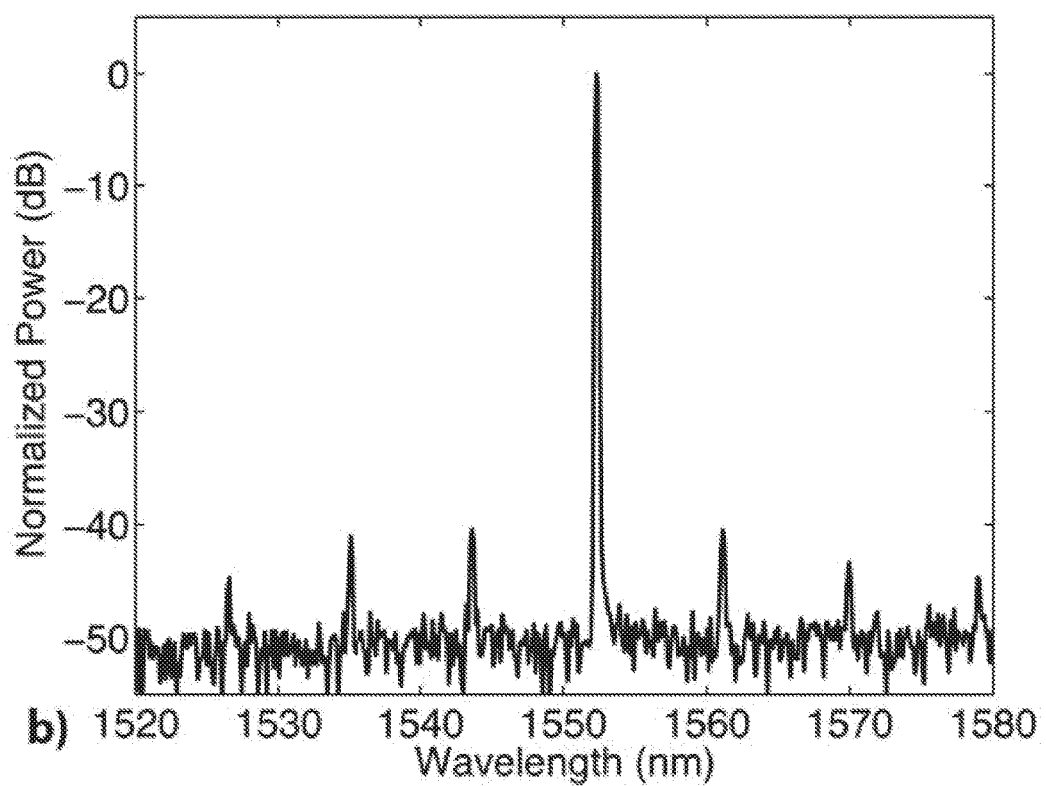
FIG. 5C is a graph of the laser spectrum measured using a fiber array shows clear fingerprints of the ring filter and 40 dB SMSR.

The measured spectrum at 170 mA pump current using an optical spectrum analyzer with 0.1 nm resolution is plotted in FIG. 5C. Fingerprints of the ring filter spectral response are clearly seen in the laser spectrum, with mode spacing equal to the ring FSR. The lasing peak appeared at 1552.3 nm, as expected from FIG. 4. The SMSR was 40 dB. On-chip power was 1.05 mW after normalizing the grating coupler insertion loss. The major contributors of cavity loss were the mirror transmittance, 90% at the Sagnac loop on silicon chip and 10% at the SOA far-end facet, as well as the coupling loss, estimated to be over 4 dB. Angled waveguides were used on both silicon chip and SOA to avoid reflection into the cavity at the chip interface.

Figure 6:
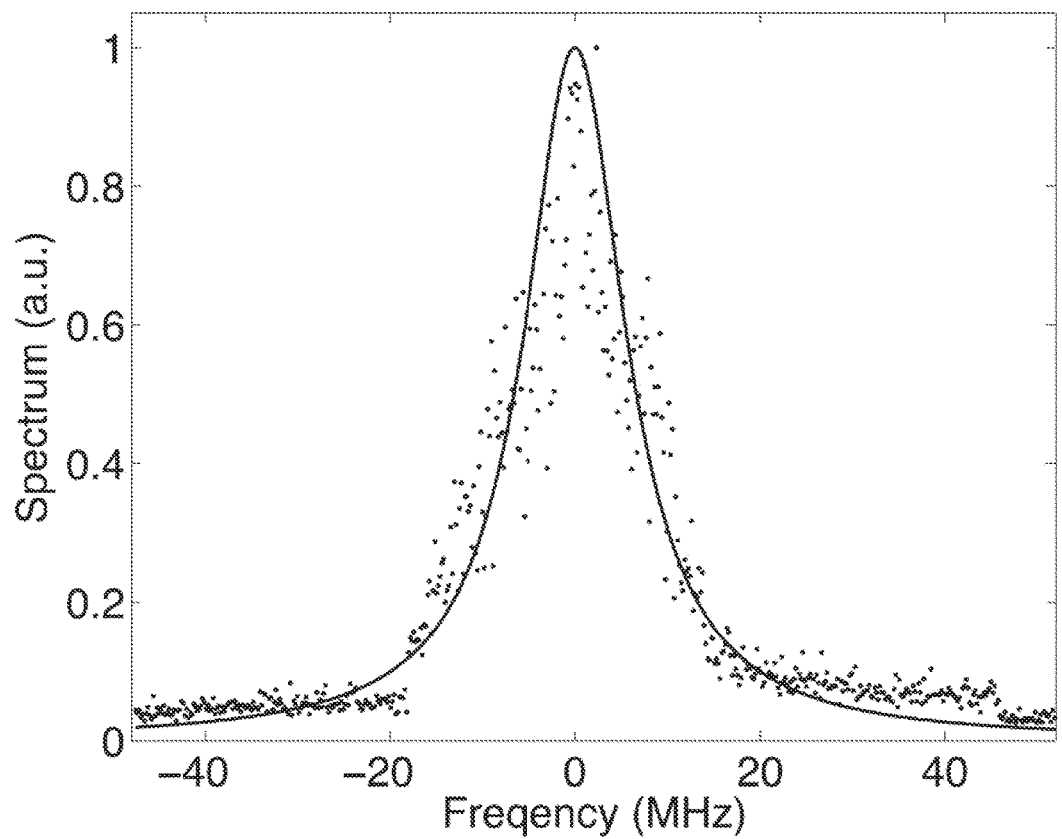
FIG. 6 is a graph of the heterodyne spectrum data (dots) and a Lorentzian fit curve with 13.27 MHz FWHM.

We performed heterodyne experiments to measure the laser linewidth. Our laser output from the fiber array was combined with the output of a narrow linewidth laser (Agilent 81600B, linewidth about 100 kHz) by a 2×2 fiber coupler. The combined optical signal (or combined optical beams) was converted into an electrical domain signal by a photodetector, whose photocurrent was fed into an RF spectrum analyzer. The heterodyne spectrum data is plotted in FIG. 6, together with a Lorentzian fit. The fitted curve shows that the FWHM of our laser is approximately 13.17 MHz.

Lithographic Micro-Ring Resonant Wavelength Control

As shown in FIG. 5C, although with a high SMSR of 40 dB, a number of longitudinal modes are available, up to 10 dB over the ASE noise floor. This is because the micro-ring filter 230 is a comb filter, and the SOA gain spectrum is relatively wide and flat. The laser is vulnerable to perturbations and the lasing wavelength may hop to the next cavity longitudinal mode. It can be addressed by increasing the ring free spectral range (FSR). If the FSR is wider than the flat gain spectrum, all other cavity modes will be suppressed.

A potential drawback of micro-rings is their sensitivity to fabrication variations. For wafers processed in a commercial CMOS fab, it has been reported that the cross-wafer spread in resonant wavelength is as large as its FSR. If the micro-ring is used as a WDM modulator, the ring resonance can be thermally tuned to the nearest grid channel, thus mitigating the fabrication sensitivity to a certain extent. However, if the micro-ring is used inside a laser cavity, the non-predictability of lasing wavelength may impede the practical application of such a device.

The effect of waveguide geometry variation on micro-ring resonance wavelength can be modeled as a perturbation to the waveguide effective index. The FSR depends on the group index of the waveguide, which is immune to fabrication errors and can be accurately controlled among wafers and process lots. If the FSR is increased to be significantly larger than the random spread of wavelengths, that spread determines the range of possible lasing wavelengths. The spread depends on ring waveguide design, the SOI wafer, and silicon processing. We chose an adiabatically widened micro-ring (AMR), which has a large FSR and is more robust against fabrication variations. In an AMR, the waveguide is narrow near the coupling region to ensure single mode operation, and then is gradually widened to support tight bend geometries and a possible need to form a metal contact. For an AMR of 2 µm radius, the FSR is as large as 54 nm.

Figures 7A, 7B, 7C:
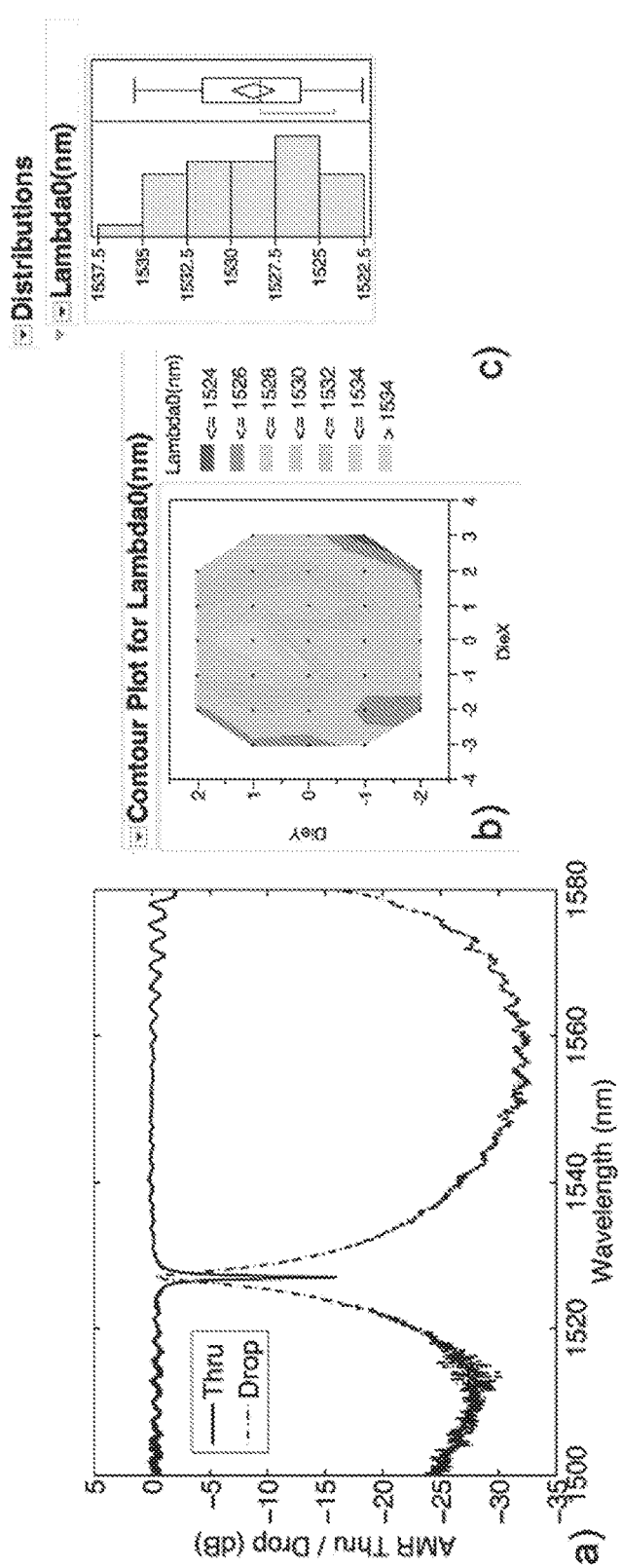
FIG. 7A is a graph showing the spectrum of the AMR drop (solid) and through (dashed) ports.
FIG. 7B is a contour plot for resonant wavelength distribution across an 8-inch wafer.
FIG. 7C is a bar chart of the statistics of the resonant wavelength distribution.

FIG. 7A is a graph showing the spectrum of the AMR drop (solid) and through (dashed) ports.

As shown in FIG. 7A, there is only one resonance peak in our testing laser's sweepable range, of 1500 nm to 1580 nm. The resonance FWHM is 1.38 nm, corresponding to a finesse of 39 or a Q-factor of 1100. We measured the same device design on all 31 complete 2.5 cm×3.2 cm reticles across an 8-inch wafer. The wafer chuck temperature was set to 30° C., where it is most stable.

FIG. 7B is a contour plot for resonant wavelength distribution across an 8-inch wafer.

FIG. 7C is a bar chart of the statistics of the resonant wavelength distribution.

The resonant wavelength distribution contours are shown in FIG. 7B and FIG. 7C and the statistics are listed in Table 1. The mean is 1528.76 nm and the standard deviation is 3.32 nm.

Figure 7D:
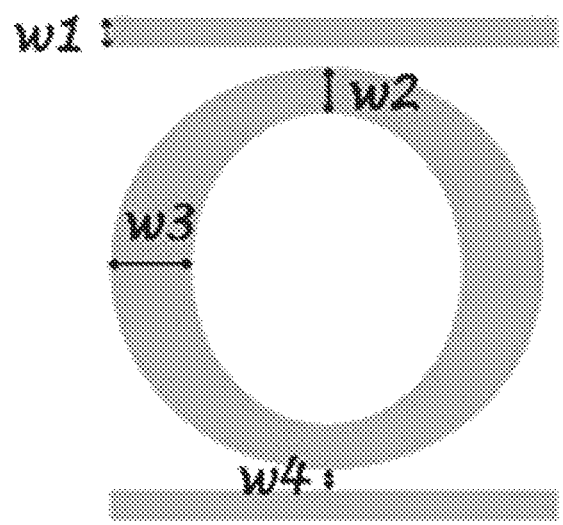
FIG. 7D is a schematic of the AMR layout. In one embodiment, w1=0.3 µm, w2=0.46 µm, w3=0.76 µm, and w4=0.2 µm.

FIG. 7D is a schematic of the AMR layout. In one embodiment, w1=0.3 µm, w2=0.46 µm, w3=0.76 µm, and w4=0.2 µm.

Figure 8:
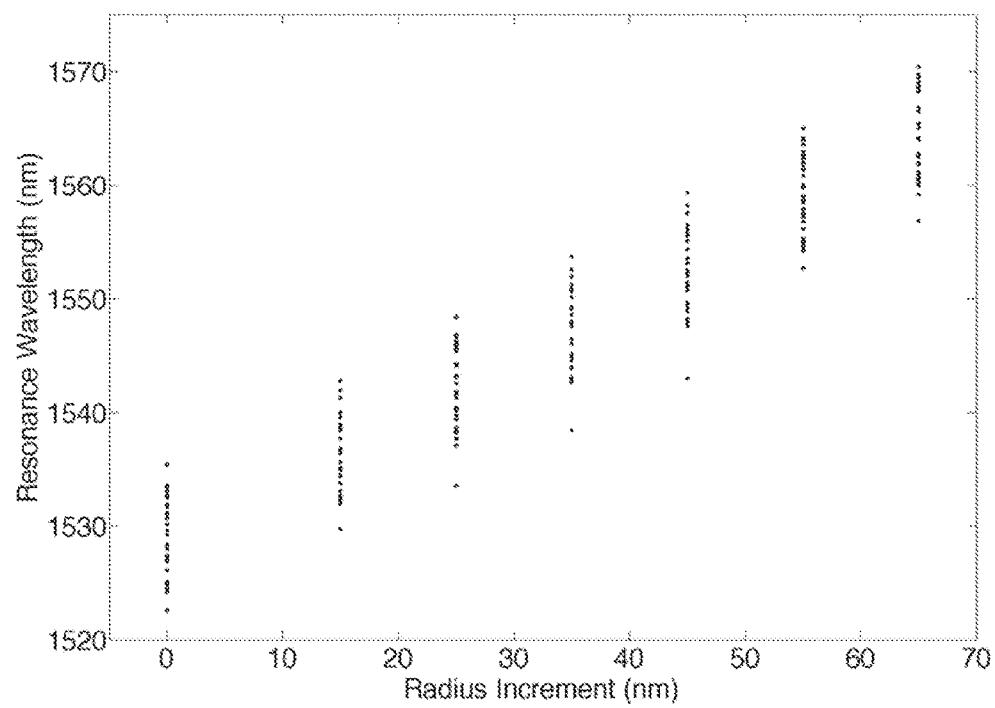
FIG. 8 is a graph that shows the AMR resonance increase as ring radius increases, measured on 31 reticles across an 8-inch wafer.

To further validate the predictability of resonant wavelength, AMRs with slightly different radii on the same wafer were also measured, and the results are summarized in FIG. 8 and Table 2. The wavelength range, maximum minus minimum, falls between 12.30 nm and 16.30 nm. The standard deviation is between 3.32 nm and 3.78 nm, with an average of 3.6 nm. The device was patterned using 248 nm lithography on SOI wafers with 20 nm thickness variations. Significant device uniformity improvement was observed by switching to 193 nm, 193 nm immersion lithography, and more uniform wafers. For WDM applications, the target wavelength can be set as the lower bound of the wavelength spread, and then locally and thermally tuned to the grid wavelength and stabilized with active feedback control.

Since the tuning range is a very small fraction of the FSR, thermal tuning power is minimal.

$Si_3N_4$ Edge Coupler

In some embodiments, one may need to address the low output power because of the coupling loss at the chip interface as a result of mode mismatch between the silicon waveguide and the RSOA waveguide. The cross-section of a typical silicon waveguide is shown in FIG. 1A and its mode profile is shown FIG. 10. The near field mode profile of the RSOA waveguide is not precisely known, but typical single mode lasers have mode field diameters (MFD) around 3 µm×1 µm. To better match the RSOA mode and reduce coupling loss, one can utilize a silicon nitride waveguide edge coupler. Silicon nitride is a CMOS compatible material, and commonly used as a hard-mask, in backend of the line (BEOL) dielectrics, and as a wafer passivation layer. After the silicon waveguide is defined, 350 nm of oxide is deposited and then planarized to 100 nm above silicon waveguide top surface using chemical mechanical planarization (CMP). Thereafter 200 nm silicon nitride is deposited and patterned by lithography and dry etching.

Figure 9:
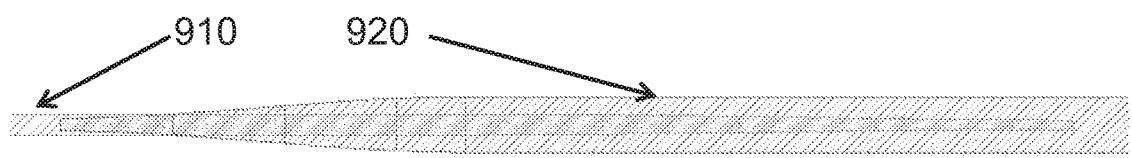
FIG. 9 is a schematic diagram of a silicon waveguide to silicon nitride waveguide coupler.

FIG. 9 is a schematic diagram of a silicon waveguide to silicon nitride waveguide coupler, in which 910 denotes silicon and 920 denotes silicon nitride.

TABLE 1

Quartiles

| | | |
|---|---|---|
| 100% | Maximum | 1535.42 |
| 75% | 3$^{rd}$ Quartile | 1531.63 |
| 50% | Median | 1528.36 |
| 25% | 1$^{st}$ Quartile | 1526.09 |
| 0% | Minimum | 5122.57 |

Summary Statistics

| | |
|---|---|
| Mean | 1528.7597 |
| Standard Deviation | 3.3156392 |
| Standard Mean Error | 0.5955064 |
| N | 31 |

TABLE 2

| | ΔR (nm) | | | | | | |
|---|---|---|---|---|---|---|---|
| | 0 | 15 | 25 | 35 | 45 | 55 | 65 |
| Min | 1522.57 | 1529.71 | 1533.52 | 1538.47 | 1543.00 | 1552.70 | 1556.80 |
| Max | 1535.42 | 1542.8 | 1548.42 | 1553.70 | 1559.30 | 1565.00 | 1570.41 |
| Range | 12.85 | 13.09 | 14.90 | 15.23 | 16.30 | 12.30 | 13.61 |
| Std Dev. | 3.32 | 3.38 | 3.59 | 3.75 | 3.78 | 3.47 | 3.62 |

TABLE 3

| Band | Description | Wavelength range |
|---|---|---|
| O | Original | 1260-1360 nm |
| E | Extended | 1360-1460 nm |
| S | short wavelengths | 1460-1530 nm |
| C | conventional ("erbium window") | 1530-1565 nm |
| L | long wavelengths | 1565-1625 nm |
| U | ultralong wavelengths | 1625-1675 nm |

Figure 10:
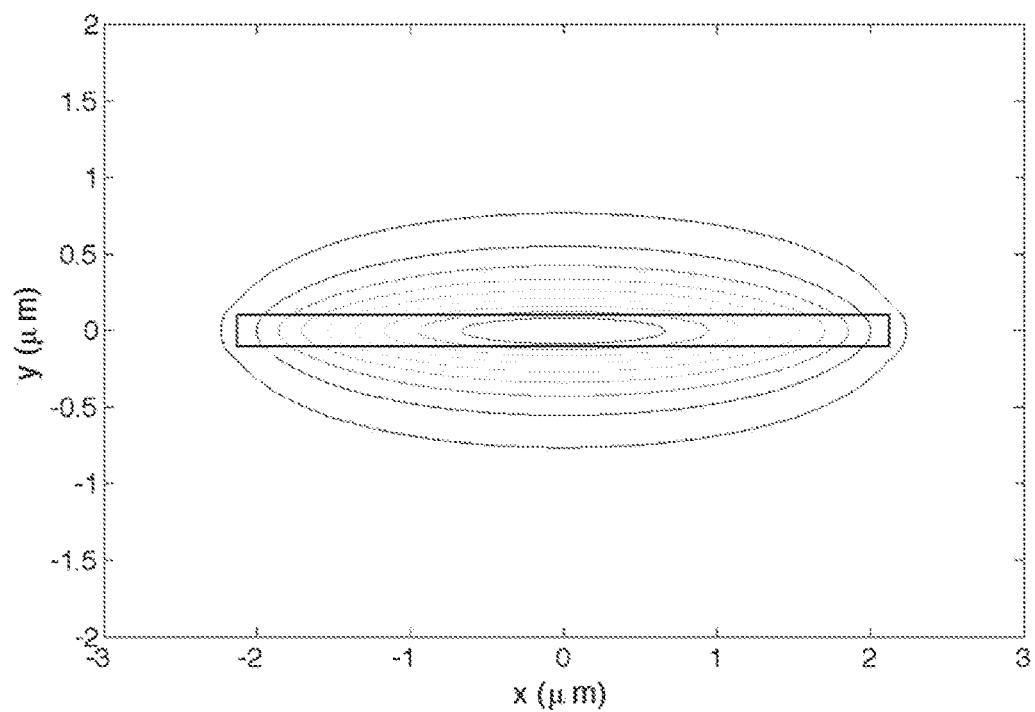
FIG. 10 is a schematic diagram illustrating the mode profile of a silicon nitride waveguide of size 4.25 µm×0.2 µm.

Light is coupled from silicon waveguide to nitride waveguide using a push-pull coupler, as shown in FIG. 9. The silicon waveguide guide width is tapered down from 0.5 µm to 0.18 µm, while the silicon nitride waveguide width increases gradually from 0.25 µm to 1.0 µm. The insertion loss of this coupler is measured to be 0.3 dB. Then the silicon nitride waveguide width is adiabatically tapered to 4.25 µm. FIG. 10 is a schematic diagram illustrating the mode profile of a silicon nitride waveguide of size 4.25 µm.times.0.2 µm. The refractive index of silicon nitride is 1.95-2.0. With a 0.2 µm thickness, it is guiding, but the confinement factor is low. In the vertical direction, a large portion of the mode is in the oxide cladding, as shown in FIG. 10. The MFD of this silicon nitride waveguide is 3.5 µm.times.0.7 µm, better matching a typical SOA mode.

Figure 11B:
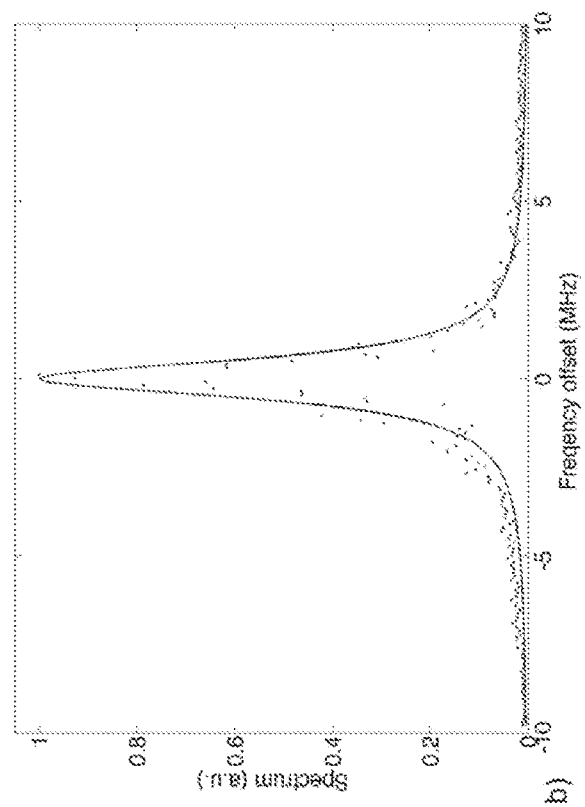
FIG. 11B is a graph of the heterodyne spectrum (dots) as a function of frequency offset and a Lorentzian fit curve with 1.28 MHz FWHM.
Figure 11A:
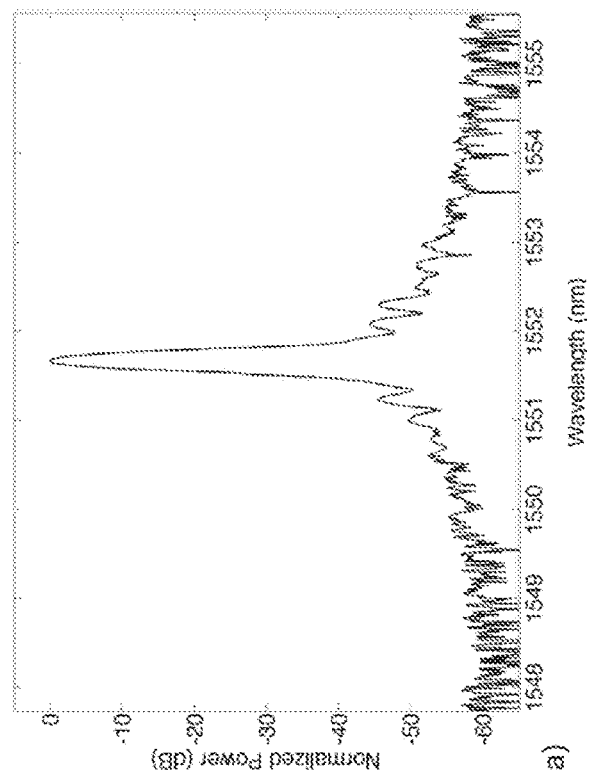
FIG. 11A is a graph of the optical spectrum as a function of wavelength with 0.1 nm resolution.

The alignment and measurement procedure previously described were repeated with the ARM and improved edge coupler. After the SOI chip, the RSOA chip and the fiber array were properly aligned and the RSOA pump current was turned on. A sharp threshold behavior near 60 mA was observed when increasing the pump current. At 170 mA, about 3 times the threshold current, optical power measured from the power meter is −5 dBm, which corresponds to on-chip power of 6.8 dBm or 4.8 mW after normalizing the 8.5 dB grating coupler insertion loss and 3.3 dB Y-junction insertion loss. The optical spectrum is plotted in FIG. 11A and the heterodyne spectrum is plotted in FIG. 11B. The Lorentzian fit of the heterodyne spectrum has a full width half maximum (FWHM) of 1.28 MHz, indicating the hybrid laser linewidth is about 1.2 MHz.

QD O-Band Laser

One major application of silicon photonics is high-speed data communications, such as optical interconnect in data centers. Short reach systems have standardized in the O-Band, the lowest dispersion wavelength window of standard single mode fibers. Table 3 lists the wavelength ranges of selected bands that are used in optical communication systems. Thus O-Band silicon photonics devices are of great interest. However, almost all devices demonstrated up to date operate at C-Band, the fiber low loss window, because of the wider availability of lasers, amplifiers, and other testing apparatus at this wavelength range.

To first order, passive device geometry scales with wavelength, free carrier plasma effect used for modulation is not wavelength sensitive, and germanium in photodetectors has stronger absorption at O-Band. The gain spectrum of typical materials cannot cover both wavelengths, so a different gain medium needs to be considered. Conventional quantum well lasers can be used, but QD lasers have better performance in terms of low threshold current and low thermal sensitivity.

A QD based RSOA was employed. It is based on indium arsenide quantum dots in gallium arsenide with aluminum gallium arsenide barriers and commercially available off-the-shelf, for example from Innolume GmbH, Konrad-Adenauer-Allee 11, 44263 Dortmund, Germany. Facet reflectivity is >99% for the high reflective end and <1% for the anti-reflective end. The silicon chip layout and alignment procedure is similar to the previous device. It inherits the unique advantages of QD lasers, and maintains the maturity of a commercial RSOA, and the CMOS compatibility of the silicon photonics chip.

FIG. 12A is a graph of laser bias voltage and output power as a function of pump current.

FIG. 12B is a graph of the optical spectrum of the QD O-Band laser.

The threshold is at 90 mA. Some kinks due to mode hopping when current is swept are also available, which is common to hybrid silicon photonics lasers. The kink near 250 mA is irregular and most likely due to mechanically or thermally induced alignment perturbations. Lasing peak appears at 1302 nm and over 50 dB SMSR is obtained.

Figure 13:
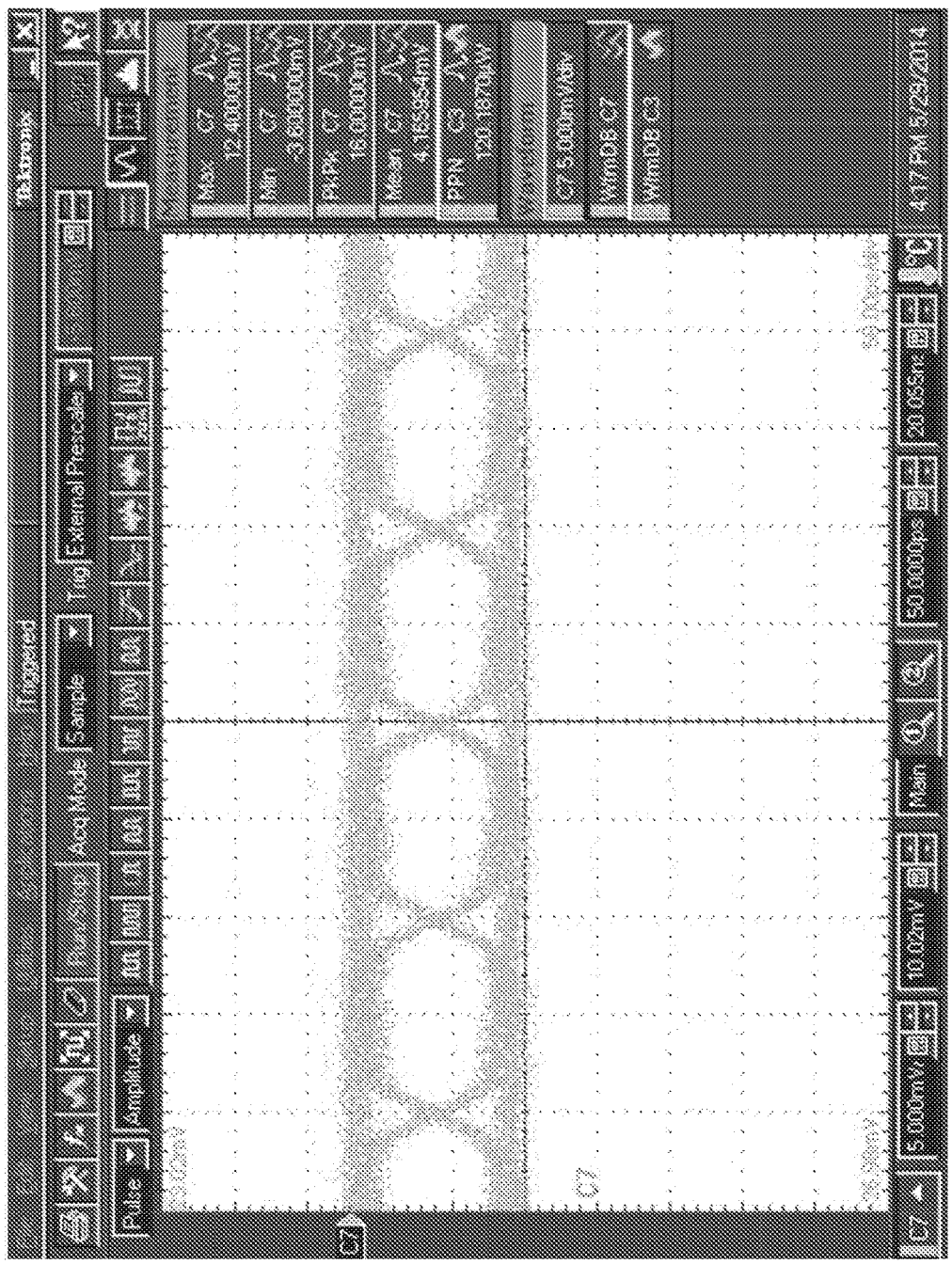
FIG. 13 is a screenshot of eye diagrams of laser output externally modulated at 10 Gb/s.

Data transmission experiments were performed to further verify the viability of the hybrid external cavity laser. The laser output is non-return to zero (NRZ) modulated using a Lithium Niobate (LiNO.sub.3) Mach-Zehnder modulator, and detected using an InGaAs photodetector. The photocurrent is amplified and displayed on a digital communication analyzer (DCA). FIG. 13 is a screenshot of eye diagrams of laser output externally modulated at 10 Gb/s. A clearly open eye diagram is observed at 10 Gb/s, as shown in FIG. 13, which is an overall testament of the laser quality, including linewidth, relative intensity noise, stability and other parameters.

Figures 14A, 14B:
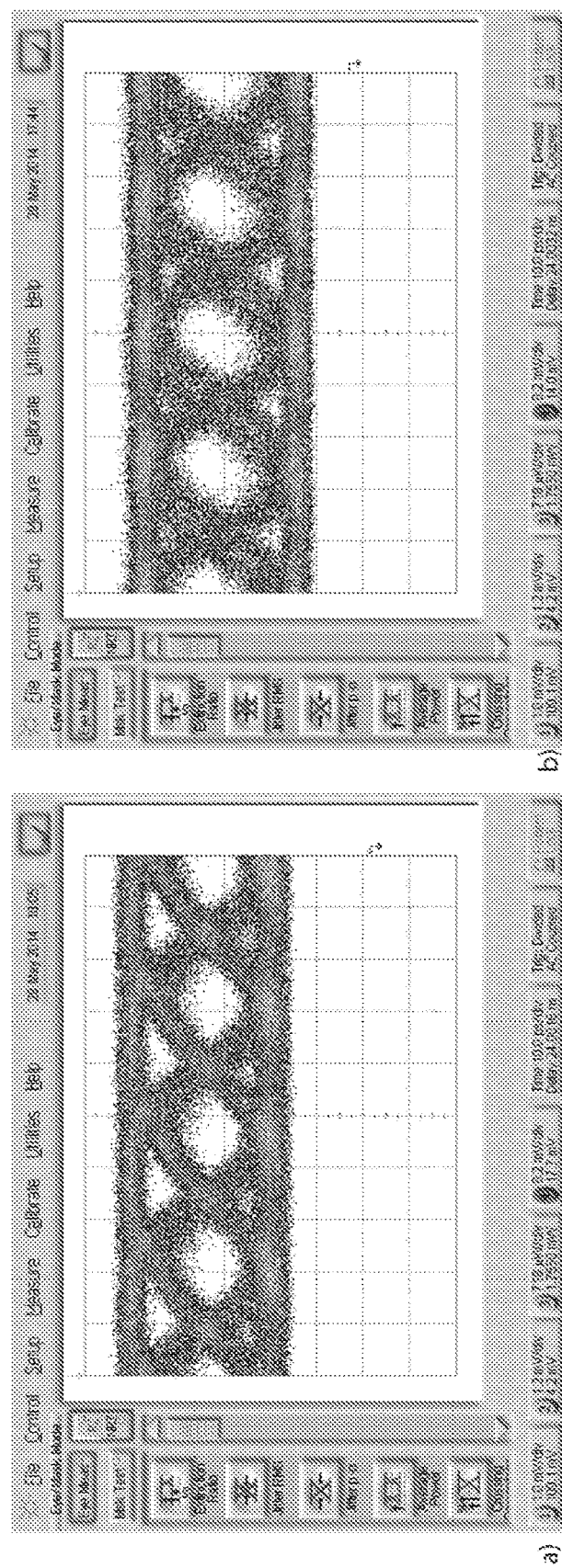
FIG. 14A is a screenshot of eye diagrams at 40 Gb/s observed in a control experiment using a commercial DFB laser.
FIG. 14B is a screenshot of eye diagrams at 40 Gb/s observed using the hybrid silicon external cavity laser according to principles of the invention.

The data rate was then increased to 40 Gb/s. A commercial DFB laser (Agere Systems A1611A/B) was used as a control. Longer rise and fall time is observed because of system bandwidth limitation. FIG. 14A is a screenshot of eye diagrams at 40 Gb/s observed in a control experiment using a commercial DFB laser.

The same tests were repeated using the hybrid silicon external cavity laser. FIG. 14B is a screenshot of eye diagrams at 40 Gb/s observed using the hybrid silicon external cavity laser according to principles of the invention. The same level of eye-openness was observed, which confirms the device under test is viable for use in high speed data application systems.

The growing volume of Internet traffic due to the ever-increasing popularity of mobile devices, high-definition video, big data, and cloud computing provides a demand for high-speed, low-cost and low power consumption communication technology. Silicon photonics is a promising technology that is expected to address such needs because it enables compact device footprints using a platform which is compatible with the manufacturing facilities used for complementary metal-oxide-semiconductor (CMOS) electronics.

The micro-ring is a unique device enabled by submicron silicon waveguides and the high index contrast between silicon and silicon oxide. Microring modulators can be more energy efficient, and orders of magnitude smaller than travelling wave Mache-Zehnder modulators. Microrings are also widely used as wavelength filters and multiplexers, which are compact and thermally tunable. High-order ring filters with flattened top and steep out-of-band rejection have also been reported. Ring resonance stabilization that mitigates thermal and fabrication sensitivity has been demonstrated as well.

Figure 15:
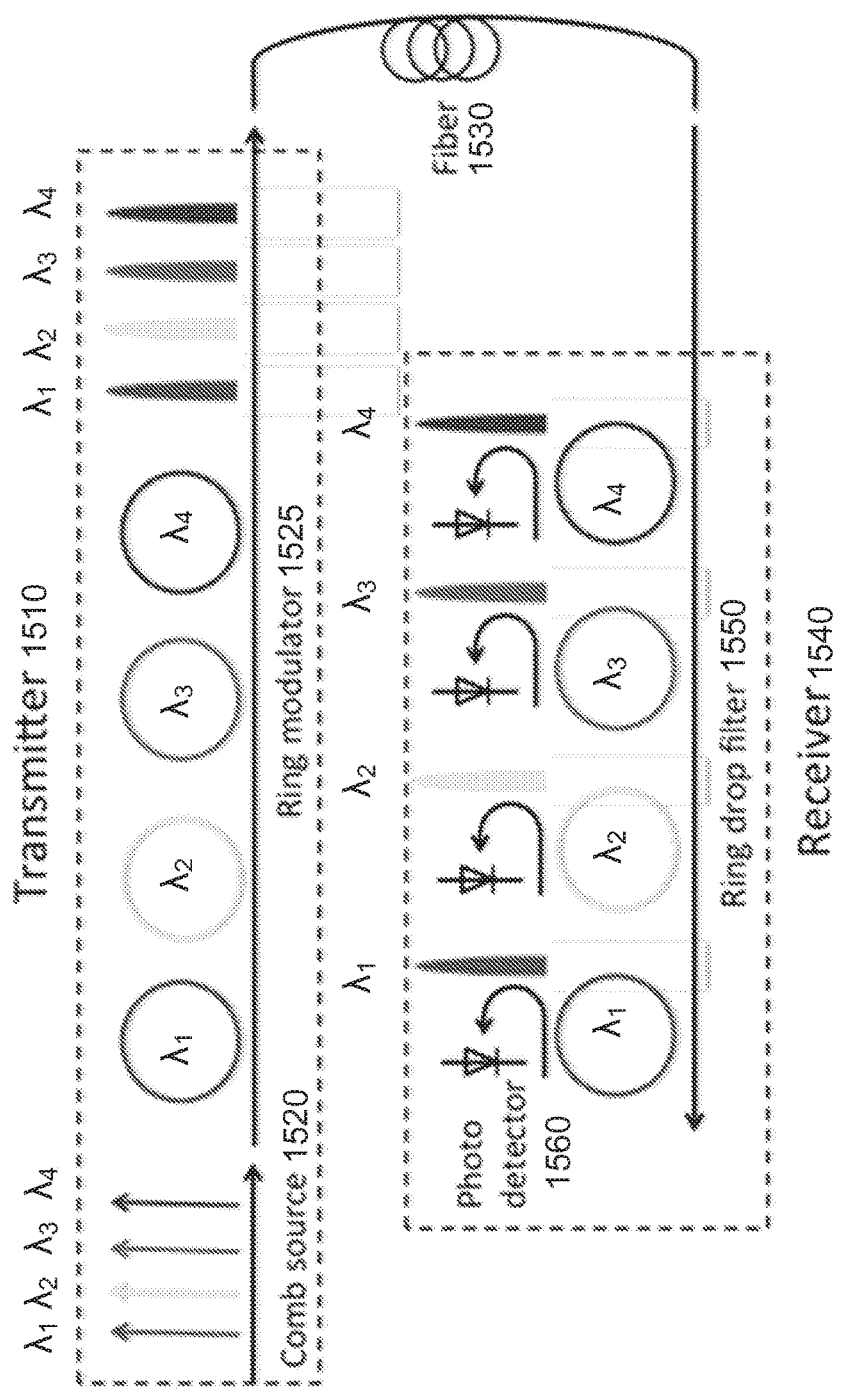
FIG. 15 is a schematic diagram of a micro-ring based WDM data transmission system.

Another advantage of the micro-ring is its intrinsic wavelength division multiplexing (WDM) capability. FIG. 15 is a schematic diagram of a micro-ring based WDM data transmission system of the prior art. On the transmitter 1510 side, light at different frequencies $\lambda_1, \lambda_2, \lambda_3, \lambda_4$ from a comb source 1520 is modulated by multiple ring modulators 1525 on a common bus waveguide. The transmitted modulated and multiplexed signal travels by way of an optical fiber 1530. On the receiver 1540 side, the signals in different channels corresponding to $\lambda_1, \lambda_2, \lambda_3, \lambda_4$ are first dropped using a micro-ring filter 1550, and then fed into a respective photodetector 1560. High performance micro-ring modulators, wavelength filters and germanium photodetectors have been extensively studied.

Having an integrated comb source is advantageous to the micro-ring based WDM transceiver, but such sources remain elusive in the literature. The comb source could be made of an array of lasers followed by a wavelength multiplexer, but laser arrays are usually expensive due to the limited yield and relatively low manufacturing volumes of III/V single-mode compound devices.

The other option is to use a single laser that simultaneously generates multiple lasing lines at different wavelengths. One way to build such a multi-wavelength laser is to utilize fiber nonlinearity. Successful generation of 1520 nm wavelengths and 31.8 Tb/s transmission was demonstrated by V. Ataie, et al. However nonlinear fiber based comb sources are bulky and hard to integrate. Conventional semiconductor Fabry-Perot (FP) lasers support multiple longitudinal modes, but amplitude of each mode can fluctuate significantly even if the total power is stable, due to competition for optical gain among different longitudinal modes, which is called mode partitioning. Thus an individual longitudinal mode in FP lasers cannot be modulated for data transmission. More recently, it was reported that quantum dot (QD) FP lasers have much lower mode partition noise due to strong spectral hole burning. While promising, lasing wavelengths of such FP QD laser are determined by the cavity length, which necessitates accurate cleaving of materials and is difficult to fabricate using traditional methods.

We now describe what we believe is the first hybrid integrated external cavity, multi-wavelength laser fabricated by integrating a semiconductor optical amplifier (SOA), e.g. a QD reflective semiconductor optical amplifier (RSOA) and a semiconductor, e.g. silicon, photonics chip. The device may comprise a quantum dot reflective semiconductor optical amplifier and a silicon-on-insulator chip with a Sagnac loop mirror and micro-ring wavelength filter. The QD RSOA is the gain medium with low mode partition noise, while a half-cavity on the silicon chip provides lithographically defined wavelength selective reflection. We demonstrate four major lasing peaks near 1300 nm from a single cavity with less than 3 dB power uniformity. More or less wavelength channels may be selected from any one of the optical wavelength ranges or bands used in telecommunication, e.g. O-band, C-band, S-band, L-band, U-band, and e-band. We also demonstrate error-free 4×10 Gb/s data transmission, that is, simultaneous error-free data transmission on each wavelength. The fully or partially integrated structure described hereinbefore with reference FIG. 2, may also be used for a multi-wavelength laser with the appropriate wavelength filter and gain element.

Device Design

Figure 16:
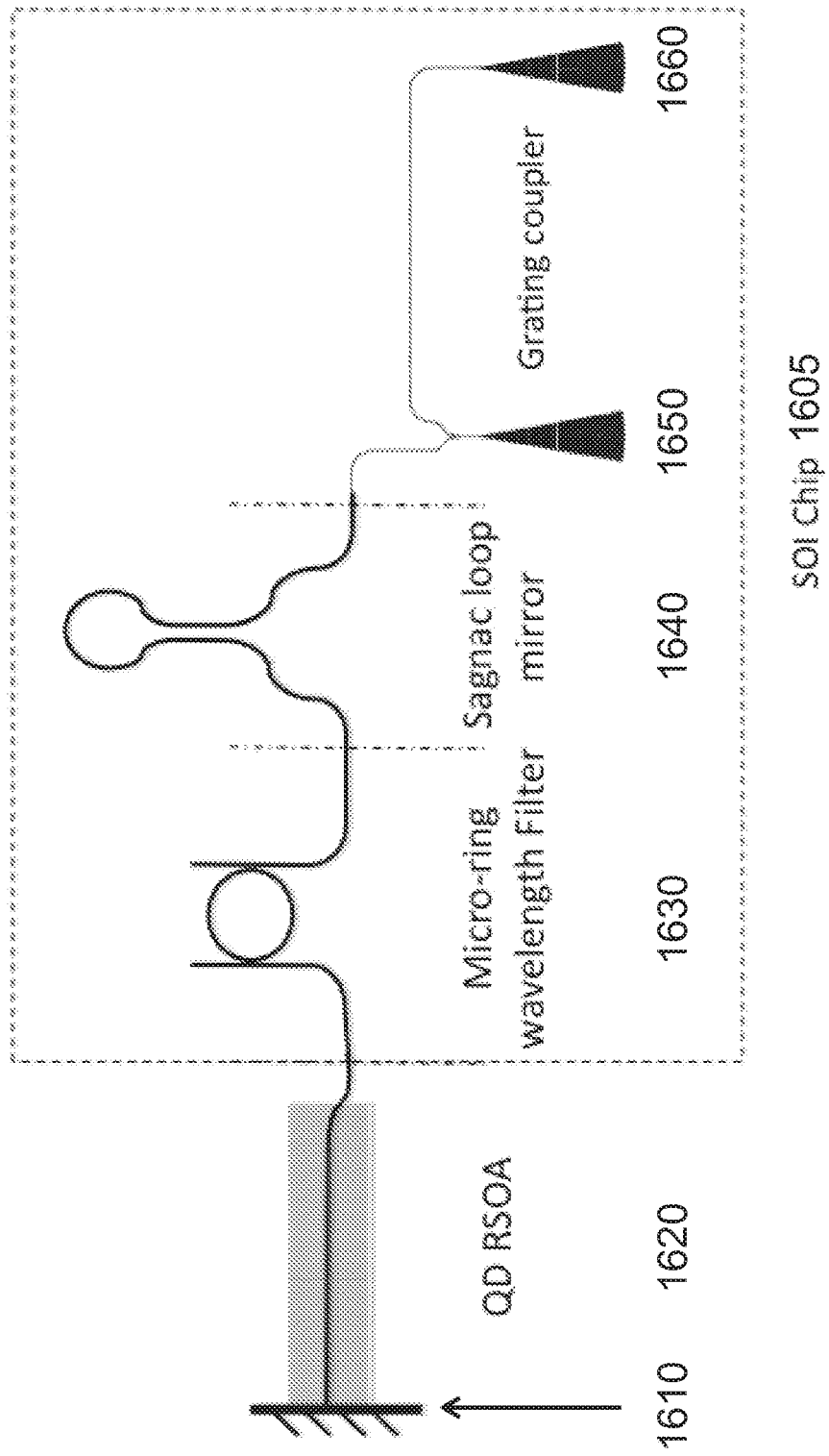
FIG. 16 is a schematic diagram of an embodiment of a QD RSOA/silicon hybrid multi-wavelength laser that operates according to principles of the invention.

FIG. 16 is a schematic diagram of an embodiment of a SOA/semiconductor, e.g. QD RSOA/silicon, hybrid multi-wavelength laser that operates according to principles of the invention. A first half-cavity is comprised of the SOA, e.g. the QD RSOA 1620, is based on Indium Arsenide quantum dots in Gallium Arsenide with Aluminum Gallium Arsenide barriers. The QD RSOA 1620 is commercially available. A second reflector, e.g. mirror 1610, is provided, which may be a facet of the QD RSOA 1620 or other suitable reflective element. Preferably, it has a specified facet reflectivity of greater than 95%, preferably >99%, for the high reflective end and <0.1% for the anti-reflective end. The waveguide on the anti-reflective end is also curved to reduce reflection into the optical cavity.

A second half-cavity on a semiconductor, e.g. silicon, chip 1605 comprises a first reflector, e.g. a Sagnac loop mirror, 1640 and a wavelength filter, e.g. micro-ring wavelength filter, 1630. The Sagnac loop mirror 1640 can be made by connecting two waveguide on one side of a directional coupler, which is a simple and robust way to build on-chip mirrors in silicon photonics. Its reflectivity can be accurately controlled and tuned by setting a proper coupling length in the directional coupler. In this device, the two strip waveguides in the directional coupler may be 500 nm wide, 220 nm thick, and separated by 200 nm edge to edge. The coupling length is set to 15 µm to achieve 50% reflection. Other reflectivity is possible, e.g. 35% to 65% of wavelengths passing through the optical cavity. However, a Sagnac loop mirror 1640 only provides broadband reflection, so a micro-ring wavelength filter 1630 is inserted in the cavity for wavelength selection for passing the selected wavelength channels to the gain element 1620 and reflecting wavelengths other than the selected wavelength channels, e.g. higher wavelengths, lower wavelengths and in between the selected wavelength channels, away from the gain element 1620 and out of the optical cavity. In the embodiment illustrated, the ring radius is 35 µm, with 2 µm straight waveguide in coupling region, corresponding to a free spectral range (FSR) of 2 nm. Other FSR are possible, including 1 nm to 8 nm. The measured transmission spectrum of this micro-ring filter 1630 is shown as a dashed line in FIG. 18. The Y-junction in between the two grating couplers 1650, 1660 is a well-characterized device, and the purpose of including it is to allow measurement of the grating coupler efficiency using a commercial test laser and the second grating coupler.

To reduce coupling loss at the RSOA/silicon interface, light in the submicron silicon waveguide is first coupled into a silicon nitride waveguide using an inverse taper. The silicon nitride waveguide is adiabatically tapered wider in the horizontal direction to match the RSOA waveguide width. In the vertical dimension, the nitride waveguide is only 200 nm thick. This leads to a much lower confinement factor and allows the modal field to extend into the oxide cladding to better matches the RSOA mode. The designed nitride waveguide mode field diameter is 3.5 µm×0.7 µm, a typical SOA mode size. One or more phase tuners 1670 may be provided between the first reflector 1640 and the wavelength filter 1630 or between the wavelength filter 1630 and the gain element 1620 for tuning the phase of the light in the optical cavity. The phase tuners 1670 may be provided on the primary semiconductor chip 1605 or on the secondary gain element, e.g. SOA, chip 1620.

Device Characterization Chip Alignment

The semiconductor, e.g. silicon, chip 1605 was polished after wafer dicing to create a flat and smooth facet for butt coupling. No anti-reflective coating was applied on the silicon chip 1605. The RSOA chip 1620 and the silicon chip 1605 were mounted on six-axis stages for alignment. The RSOA chip 1620 was kept at 25° C. using a thermo-electric cooler (TEC), while the silicon chip 1605 remained at ambient temperature of the metal stage. 210 mA of pump current was provided to the RSOA from a DC source during alignment. A lensed fiber coupled to the 0.1% anti-reflective facet was used to monitor the cavity ASE or lasing power as a feedback for active alignment. After the QD RSOA 1620 and silicon chip 1605 were properly aligned, a fiber array was brought in to capture the output from the grating coupler.

Figure 17:
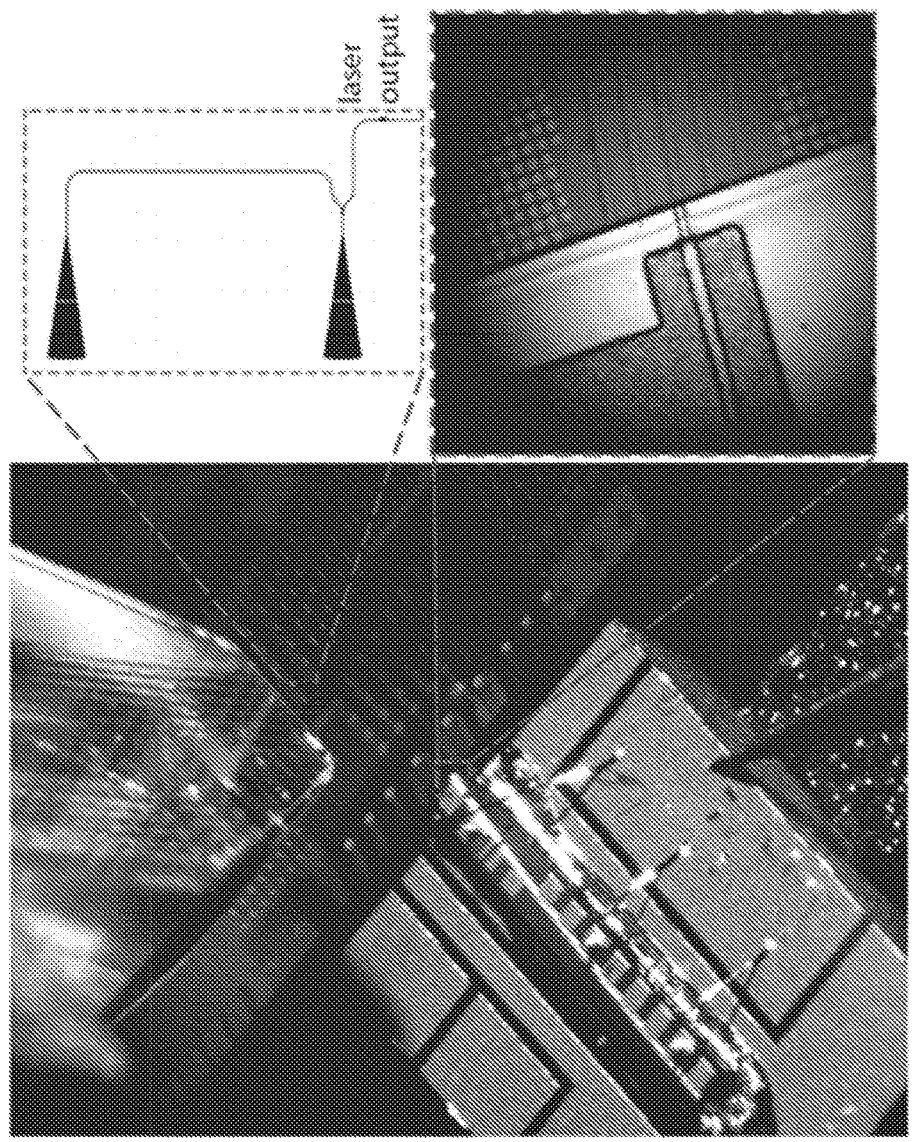
FIG. 17A is an image of the alignment setup. The fiber array can be seen in the top left of the figure.
FIG. 17B is a close-up view of the RSOA/silicon chip interface.
FIG. 17C is a schematic diagram of the grating coupler on chip, containing a Y-junction and an additional output coupler to assist fiber array coupling.

FIG. 17A is an image of the alignment setup. The fiber array can be seen in the top left of the figure.

FIG. 17B is a close-up view of the RSOA/silicon chip interface.

FIG. 17C is a schematic diagram of the grating coupler on chip, containing a Y-junction and an additional output coupler to assist fiber array coupling.

Laser Spectrum and LIV

Figure 18:
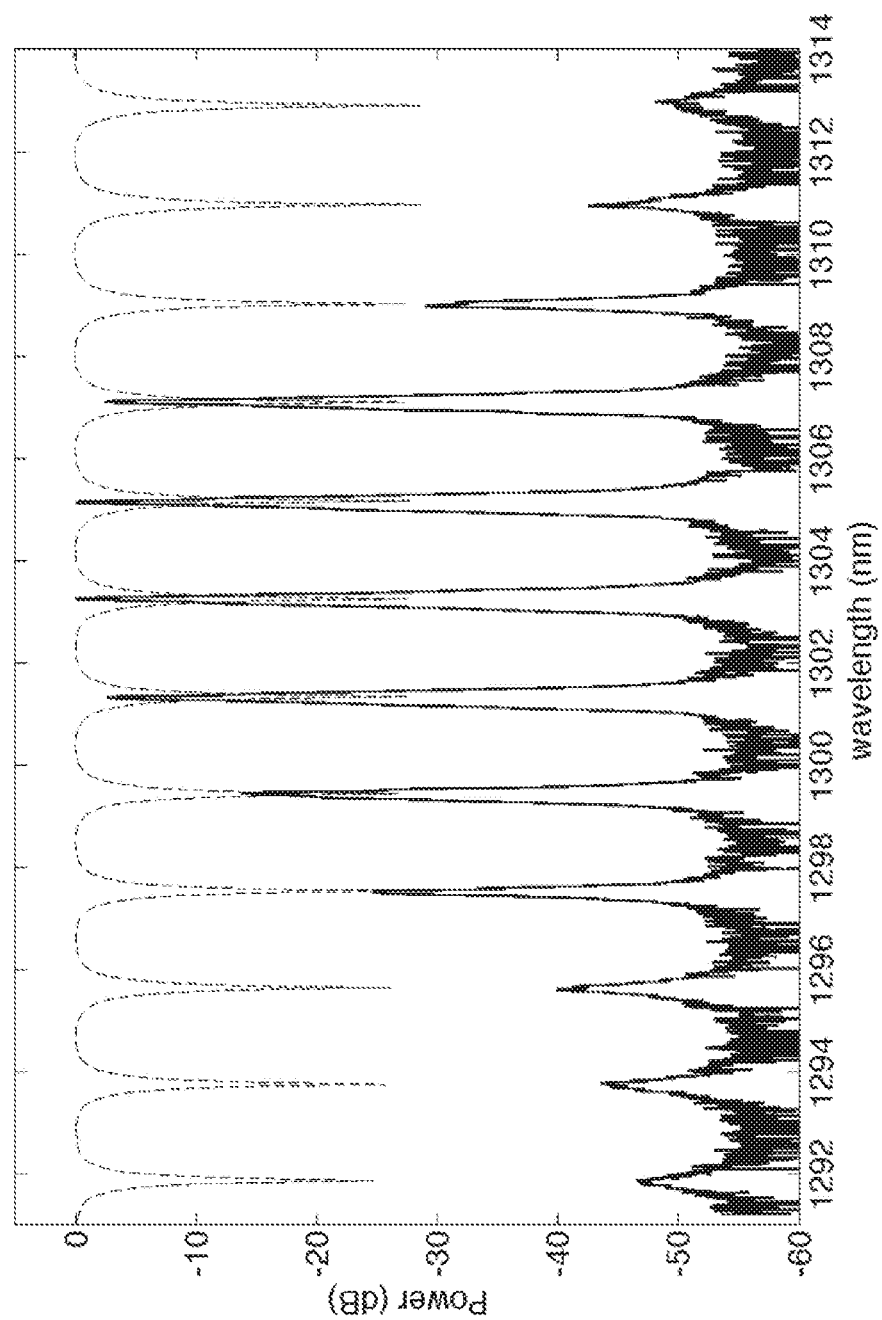
FIG. 18 is a graph showing a laser spectrum (solid line) and micro-ring filter transmission spectrum (dashed line) observed from the QD RSOA/silicon hybrid multi-wavelength laser.

The output of the fiber array was connected to an optical spectrum analyzer. FIG. 18 is a graph showing a laser spectrum (solid line) and micro-ring filter transmission spectrum (dashed line) observed from the QD RSOA/silicon hybrid multi-wavelength laser. Multiple lasing peaks for a plurality of different, spaced apart wavelength channels were demonstrated, and the laser mode spacing matches the FSR of the micro-ring filter, which is 2 nm as mentioned earlier, but could be any desired FSR, e.g. 1 nm to 8 nm. Four major lasing peaks were observed between 1300 nm and 1308 nm, with less than 2.6 dB power non-uniformity.

Figure 19:
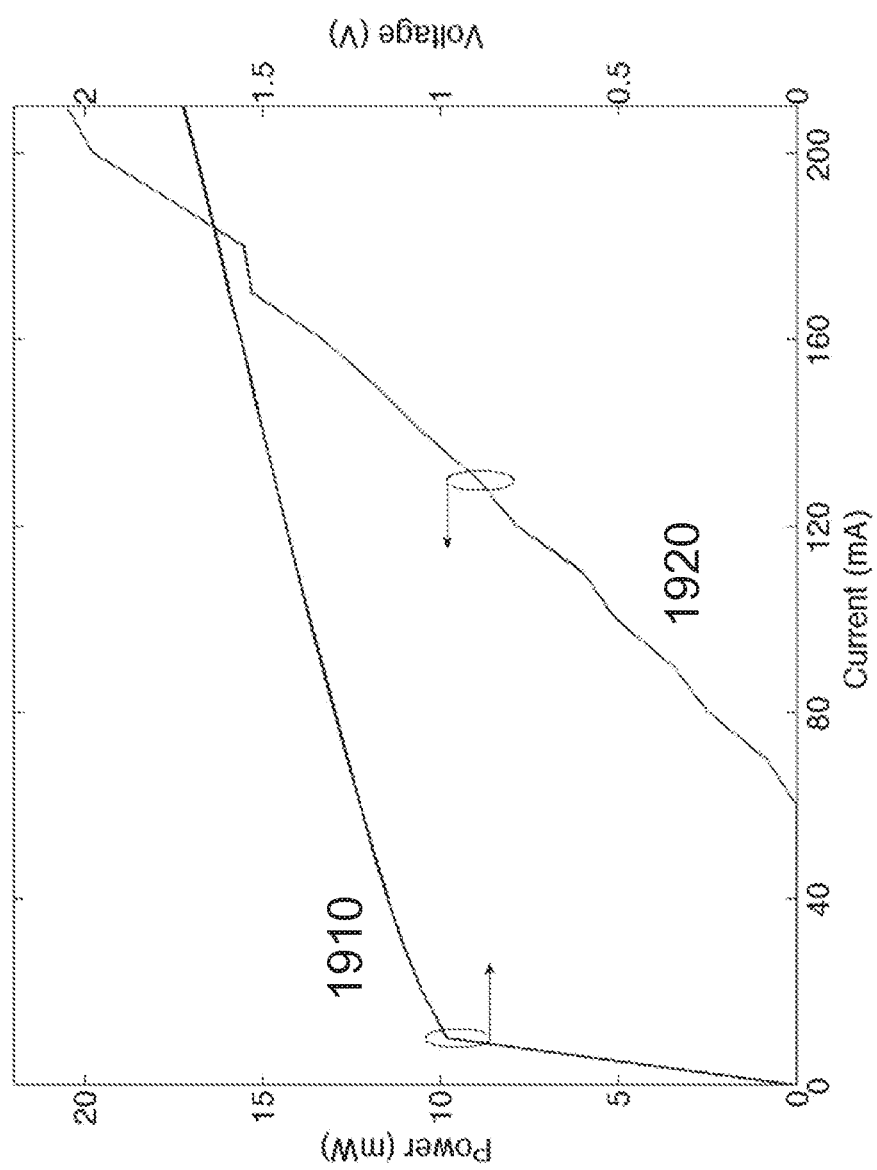
FIG. 19 is a graph of laser output power and forward bias voltage as a function of drive current.

FIG. 19 is a graph of laser output power and forward bias voltage as a function of drive current. The line 1910 shows a typical rectifying IV curve of a p-n diode, and the line 1920 indicates a threshold current of 60 mA. The on-chip output power at 200 mA, about three times the threshold, is 20 mW. This corresponds to a wall-plug efficiency (WPE) of 5.9%.

Demonstration of Data Transmission

Figure 21A:
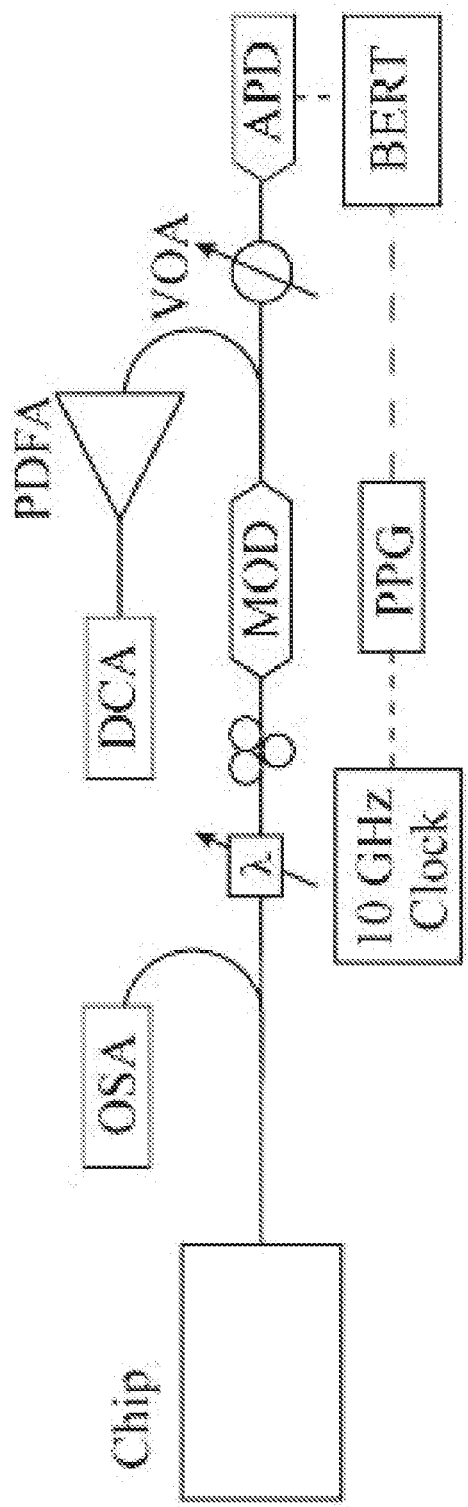
FIG. 21A is a schematic diagram illustrating the testing hardware configuration.

To validate the viability of the multi-wavelength laser for WDM data communication applications, each laser peak was filtered out using a commercial tunable filter and modulated using a commercial Lithium Niobate Mache-Zehnder modulator, as illustrated in FIG. 21A. The datastream used for modulation is a 10 Gb/s non-return to zero (NRZ) $2^7-1$ pseudo random bit sequence (PRBS). The modulated optical signal was split into two branches. One branch was amplified using a Praseodymium-doped-fiber-amplifier (PDFA) and displayed on a digital communication analyzer (DCA). The other branch was first connected to variable optical attenuator, then to an avalanche photodiode (APD) and a bit error rate tester.

Figures 20A, 20B, 20C, 20D, 20E, 20F:
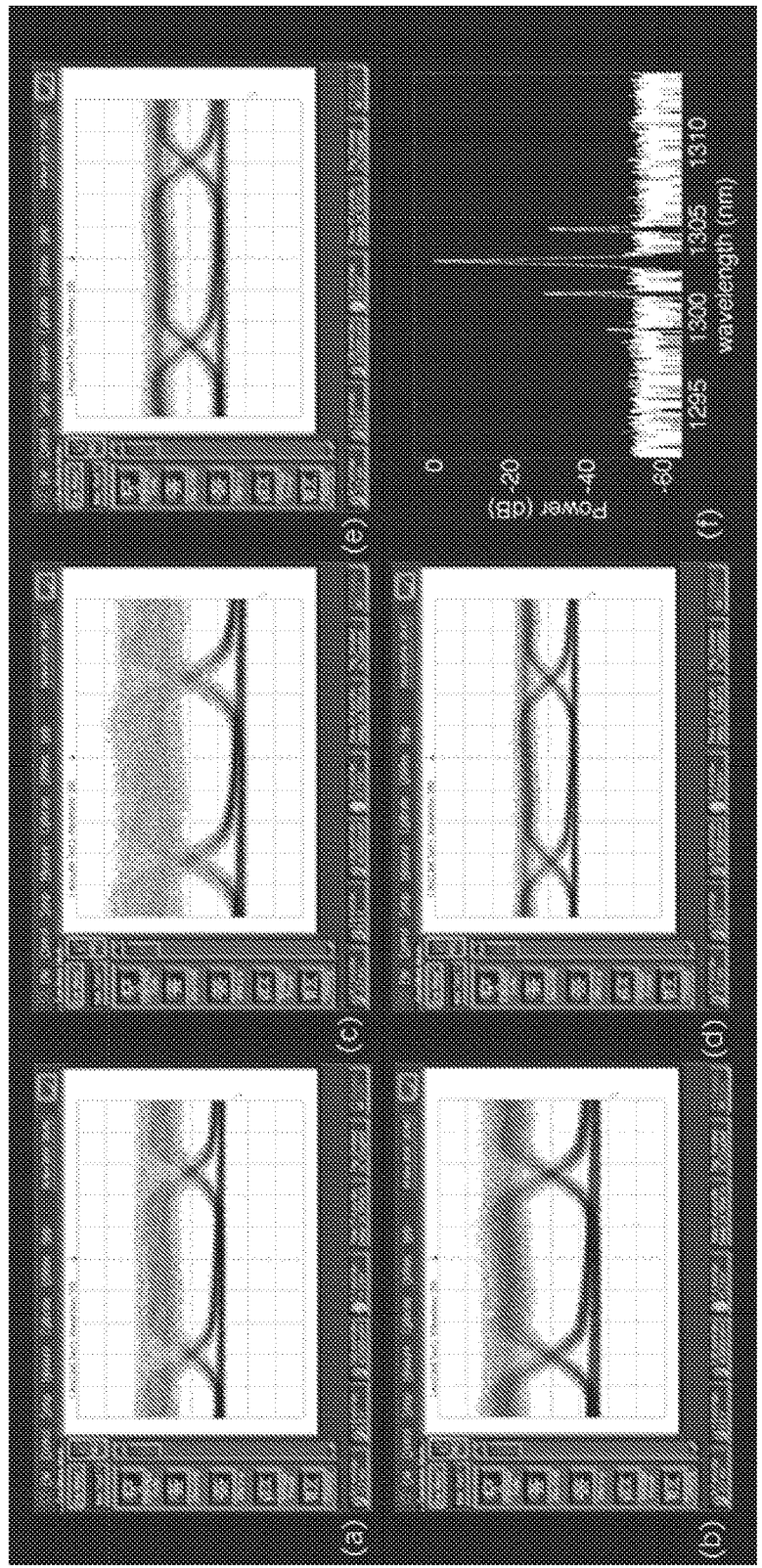
FIG. 20A through FIG. 20D are eye-diagrams that correspond to channel 1-4, respectively.
FIG. 20E is a control experiment using a commercial DFB.
FIG. 20F is a graph showing one filtered spectrum.
Figure 21B:
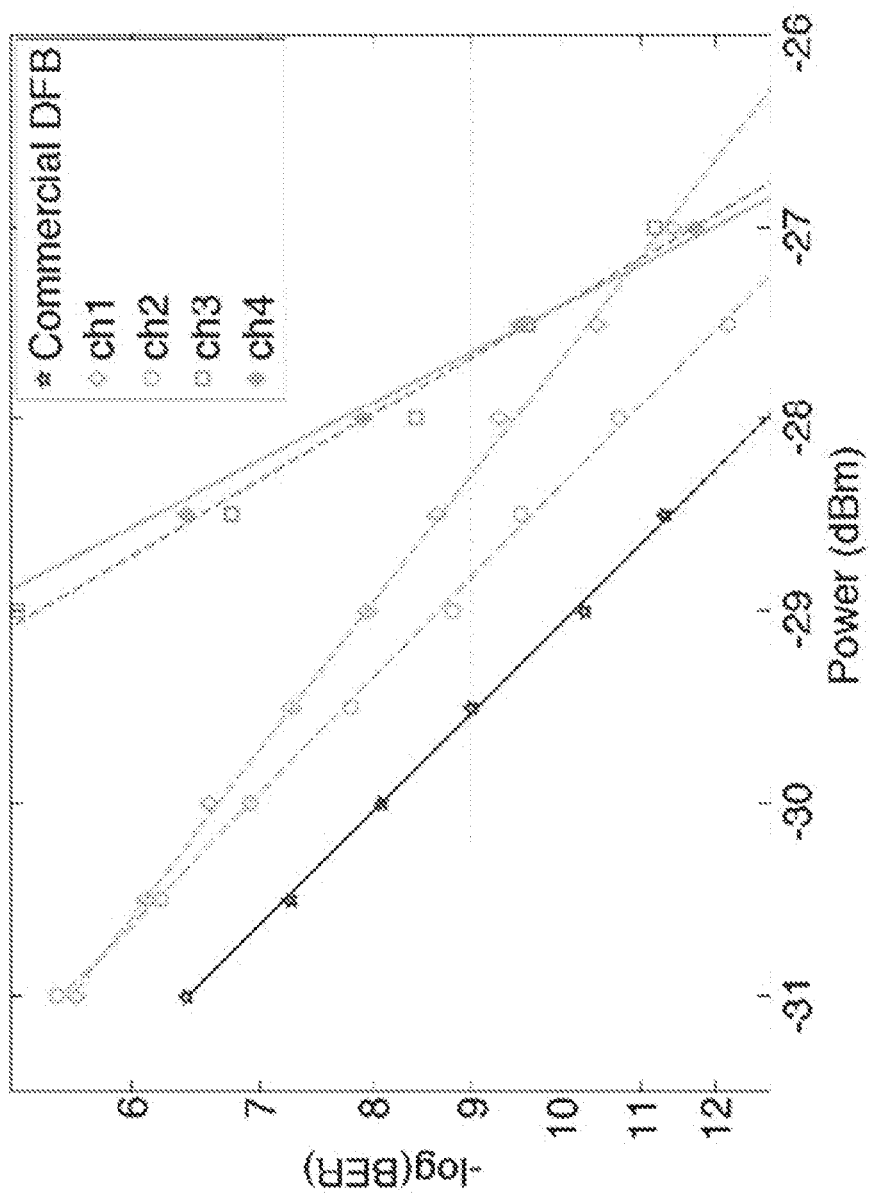
FIG. 21B is a graph of the bit error rate as a function of received power.

The eye diagrams from the 4 lasing peaks are shown FIG. 20A to FIG. 20D, along with the filtered spectrum of one of the peaks (FIG. 20F). An eye diagram of a control experiment conducted using a commercial 1310 nm laser is shown in FIG. 20E. Open eye diagrams are observed on all four channels, qualitatively confirming successful data transmission. Recorded bit error rate (BER) as a function of received power is plotted in FIG. 21B. At $10^{-9}$ bit error rate, all channels have less than 2 dB power penalty compared to the commercial laser. One notes that the eye diagrams and receiver sensitivity from different channels are slightly non-uniform because the relative position of the RSOA and silicon chip drifted over the period of the BER measurement. This drift could be eliminated by bonding the RSOA and silicon chips together using epoxy or by upgrading the alignment stages.

With reference to FIG. 22, an alternative embodiment of a semiconductor laser 300 includes an output port 350 optically coupled to an optical cavity 305, which includes a first partial reflector 340, typically comprising a Sagnac loop reflector or some other suitable submicron waveguide reflector. The output port 350 may include one or more butt-couplers, using tapers or inverse tapers for expanded beam coupling, and using lenses or lens arrays for coupling.

The first partial reflector 340 is typically used for broadband reflection at one end of the optical cavity 310. The Sagnac loop reflector 340 may be comprised of a directional coupler (DC) with two of the branches coupled together on one side. The reflectivity of Sagnac loop Mirror 340 may be accurately controlled by adjusting a coupling length of the branches. Ideally the Sagnac loop mirror 340 contains no ultra-fine features other than two parallel waveguides, and may be fabricated by a single etch step on a suitable substrate 345, e.g. silicon. Typically, the reflectivity of the first partial reflector 340 is about 50%; however, other reflectivity is possible, e.g. 35% to 65% of wavelengths passing through the optical cavity.

A wavelength filter 330 may be optically coupled to the first partial reflector 340 within the optical cavity 305, and may be comprised of a micro-ring that is fixed at a critical coupling condition for wavelength filtering. In the embodiment illustrated in FIG. 22, the wavelength filter 330 is comprised of a racetrack ring resonator. The ring may have a radius of 10 µm, and a 1.5 µm long straight DC to maintain critical coupling. The ring FSR may be 8.7 nm, and the FWHM may be 0.075 nm, corresponding to a Q of 20 000. The ring resonator 330 may be a comb filter and may have multiple pass bands, whereby the laser is expected to lase at one or more resonant wavelengths near the top of the gain spectrum of a gain element 220, as hereinafter described.

A gain element 320 may be a gain medium provided in a gain cavity in or on the substrate 345 or provided in a separate gain element chip 315, as illustrated in FIGS. 23 and 24. The gain element 320, e.g. the gain medium in the gain cavity, and the filter 330 are provided within the optical cavity 305 structure in serial communication. In different embodiments, the gain element 320, e.g. the gain medium in the gain cavity, and the filter 330 may be provided in any order, as long as the serial communication is preserved. The gain element 320 may include a silicon optical amplifier (SOA) or a Group II/V material on the same substrate 345 or a separate substrate 315.

A second reflector 310, which may have a higher reflectivity, e.g. greater than 90%, preferably greater than 95%, and ideally greater than 99%, and low transmittance, is used at the other end of the optical cavity 305. Implementation of the second reflector 310 depends on the gain medium integration technique. The second reflector 310 may be the high reflection end facet of one of the substrates 315 or 345 (FIG. 22), a reflective facet of the SOA in the case of edge-coupled integration (FIG. 23), another Sagnac loop mirror in the case of the direct bonding approach, or another silicon chip 545 (FIG. 24), for example fabricated from an SOI wafer coupled to the far side of the gain element chip 315. The second reflector 310 and the first reflector 340, form the ends of an optical cavity (or optical resonator) structure 305.

One or more phase tuners 370 may be provided between the first reflector 340 and the wavelength filter 330 or between the wavelength filter 330 and the gain element 320 for tuning the phase of the light in the optical cavity 305. The phase tuners 370 may be provided on the primary semiconductor chip 345 or on the secondary gain element, e.g. SOA, chip 315. The phase tuners 370 may be tuned using a thermal tuner, electronic injection or any other suitable means. The phase tuners 370 may adjust and control the phase of the laser cavity modes so that the resonant condition, i.e. resonant wavelength(s), of the cavity 315 matches a desired wavelength of the filter 330, e.g. the center wavelength or just off center, to thereby maximize the amount of light at the resonant wavelength that gets passed through the filter 330, while minimizing the light at other wavelengths. Accordingly, the phase tuners 370 may also be used to adjust and control the operating condition of the laser 300, in particular, tune the laser cavity 305 to at least partially compensate for changing conditions, e.g. temperature, age, etc. Providing tunable a tunable filter 330 and phase tuners 370 to tune the resonant wavelength of the cavity, may also enable a tunable laser 300.

In preferred embodiments, for purposes of convenience of manufacture, it may be helpful to have the filter 330 and the first reflector 340, in physical proximity to each other if the filter 330 is a micro-ring filter. The micro-ring filter 330 and the Sagnac loop reflector 340 may be independent and may be optimized separately.

In some embodiments, the optical cavity 305 may be operated using uncooled operation, in which the temperature is allowed to be free-running. In some embodiments, the optical cavity 305 may be operated non-hermetically. In some embodiments, one or more components of the optical cavity 305 may be hermetically sealed at the die level.

In some embodiments, there are included one or more highly reflective, partially reflective or wavelength selective optical coatings on an optical facet, e.g. on the SOA, on the silicon side of the silicon chip 345, on the Group III/V semiconductor side 315 or both.

In various embodiments, the optical cavity 305 provides an optical output beam that may comprise a single wavelength of interest, or a plurality of wavelengths of interest. In some embodiments the optical cavity 305 provides an optical output beam that is a narrow linewidth optical output beam.

FIG. 23 illustrates another embodiment of a semiconductor laser 500, in which the filter 330 is replaced by a plurality of filters, two of which are shown, e.g. filters 430a and 430b, but more are possible. The laser 500 will emit light at the wavelength or wavelengths in which a resonant condition for all the filter, e.g. 430a and 430b, is satisfied. Accordingly, a single wavelength laser 500 with broader range tunability may be provided, if the free spectral range of the combined filter is wider than the gain bandwidth of the gain element 320. The wider free spectral range may be achieved by ensuring each filter, e.g. 430a and 430b, has a different free spectral range, thereby providing additional filter passband peaks for the phase tuners 370 to tune to. The tunability is achieved by individually varying the phase of each filter, e.g. 430a and 430b, similar to the Vernier effect.

FIG. 24 illustrates another embodiment of a semiconductor laser 600, in which the filter 330 is replaced by a plurality of different filters, two of which are shown, e.g. ring filter 530a and tunable Unbalanced Mach-Zehnder Interferometer (UMZI) filter 530, but additional or different types of tunable or passive filters are possible. The difference in the lengths of the arms of the UMZI determines the UMZI FSR and therefore the FSR of the cavity 305. The unbalanced MZI provided filter-like behavior by transmitting light at specific wavelengths, in which there are places with a given free spectral range. The tunability of the filters, e.g. 530a and 530b, is achieved by individually varying the phase of each filter, e.g. thermally.

Design and Fabrication

Methods of designing and fabricating devices having elements similar to those described herein are described in one or more of U.S. Pat. Nos. 7,200,308, 7,339,724, 7,424, 192, 7,480,434, 7,643,714, 7,760,970, 7,894,696, 8,031,985, 8,067,724, 8,098,965, 8,203,115, 8,237,102, 8,258,476, 8,270,778, 8,280,211, 8,311,374, 8,340,486, 8,380,016, 8,390,922, 8,798,406, and 8,818,141, each of which documents is hereby incorporated by reference herein in its entirety.

Definitions

As used herein, the term "optical communication channel" is intended to denote a single optical channel, such as light that can carry information using a specific carrier wavelength in a wavelength division multiplexed (WDM) system.

As used herein, the term "optical carrier" is intended to denote a medium or a structure through which any number of optical signals including WDM signals can propagate, which by way of example can include gases such as air, a void such as a vacuum or extraterrestrial space, and structures such as optical fibers and optical waveguides.

As used herein, the term "optical signal" is intended to denote an optical wave or an optical beam having at least one wavelength. Unless otherwise restricted, the term "optical signal" can mean, when read in context, any of a broadband signal spanning a range of wavelengths, an optical signal having a very narrow wavelength range, or an optical signal such as a laser signal having substantially a single wavelength.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

INCORPORATION BY REFERENCE

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A semiconductor laser, comprising:
an optical port configured to provide an optical output beam comprising one or more selected optical wavelengths;
an optical cavity, in optical communication with the optical port, comprising:
a first reflector at a first end of the optical cavity, said first reflector comprising a first reflectivity; and
a second reflector at a second end of the optical cavity, the second reflector comprising a second reflectivity;
an optical gain medium in the optical cavity for amplifying light at the one or more selected wavelengths;
a filter element in the optical cavity between the optical gain medium and the optical port configured to pass light of the one or more selected optical wavelengths therethrough to and from the optical gain medium and deflect wavelengths not of interest away from said optical gain medium and the optical port to suppress stimulated emission of those wavelengths; and
a phase tuner in the optical cavity capable of adjusting a phase of the light in the optical cavity for adjusting a resonant wavelength of the optical cavity.

2. The laser according to claim 1, wherein the phase tuner adjusts the resonant wavelength to match a wavelength proximate a center wavelength of a passband of the filter element.

3. The laser according to claim 1, wherein the first reflector comprises a first Sagnac loop mirror.

4. The laser according to claim 3, wherein the first Sagnac loop mirror comprises a directional coupler including four branches; and wherein two of the branches on one side are tied together.

5. The laser according to claim 4, wherein said first reflector comprises a tunable reflector for tuning the first reflectivity by adjustment of a coupling length of the directional coupler.

6. The laser according to claim 1, wherein said filter element comprises a micro-ring based filter.

7. The laser according to claim 6, wherein said filter element comprises a plurality of micro-ring based filters, each with a different free spectral range.

8. The laser according to claim 6, wherein said filter element also comprises a tunable Mach-Zehnder wavelength filter.

9. The laser according to claim 1, wherein said filter element is configured to provide multiple pass bands, one pass band for each selected wavelength.

10. The laser according to claim 1, wherein the one or more selected wavelengths comprises only a single selected wavelength; and wherein the filter element comprises a tunable filter configured for tuning one of the pass bands to include the single selected wavelength.

11. The laser according to claim 1, wherein the one or more selected wavelengths comprises only a single selected wavelength; and wherein the filter element is configured to comprise a free spectral range wider than a gain spectrum of the optical gain medium to suppress optical cavity modes other than the selected wavelength.

12. The laser according to claim 1, wherein the optical port is coupled to the first reflector; and wherein the optical port, the first reflector and the filter element are all disposed on a first silicon chip.

13. The laser according to claim 12, wherein said optical gain medium comprises a group III/V semiconductor compound provided in a second chip coupled to the first silicon chip.

14. The laser according to claim 13, wherein said second reflector comprises a facet on the second chip.

15. The laser according to claim 12, wherein said optical gain medium comprises a semiconductor optical amplifier (SOA) optically coupled to the first silicon chip.

16. The laser according to claim 15, wherein said second reflector comprises a facet of the SOA.

17. The laser according to claim 15, further comprising a coupler between the first silicon chip and the SOA; wherein the coupler comprises a silicon waveguide with a width which tapers down, and a silicon nitride waveguide with a width which increase gradually.

18. The laser according to claim 1, wherein said second reflector comprises a second Sagnac loop mirror.

19. The laser of claim 1, wherein said second reflectivity is greater than 90% of the light in the optical cavity.

20. The laser of claim 1, wherein said first reflectivity is between 35% and 65% of the light in the optical cavity.

* * * * *